United States Patent
Okano et al.

(10) Patent No.: US 10,232,329 B2
(45) Date of Patent: Mar. 19, 2019

(54) GENERATING METHOD AND GENERATOR FOR GENERATING MIST OR FINE-BUBBLE BY USING SURFACE ACOUSTIC WAVE

(71) Applicant: PANASONIC INTELLECTUAL PROPERTY MANAGEMENT CO., LTD., Osaka (JP)

(72) Inventors: Masanori Okano, Neyagawa (JP); Shigeki Fujiwara, Ikoma (JP); Youhei Ishigami, Yao (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 31 days.

(21) Appl. No.: 15/411,328

(22) Filed: Jan. 20, 2017

(65) Prior Publication Data

US 2017/0128898 A1    May 11, 2017

Related U.S. Application Data

(63) Continuation of application No. 13/379,358, filed as application No. PCT/JP2010/059319 on Jun. 2, 2010.

(30) Foreign Application Priority Data

Jun. 22, 2009    (JP) .................................. 2009-148112

(51) Int. Cl.
*B05B 17/00*    (2006.01)
*B01F 11/02*    (2006.01)
(Continued)

(52) U.S. Cl.
CPC ........ *B01F 11/0258* (2013.01); *B01F 3/0407* (2013.01); *B01F 3/04978* (2013.01);
(Continued)

(58) Field of Classification Search
CPC . B05B 17/06; B05B 17/0607; B05B 17/0615; B05B 17/0646; B08B 3/08; B01F 3/04978; B01F 11/0258
(Continued)

(56) References Cited

U.S. PATENT DOCUMENTS 2,893,707 A * 7/1959 Gulton ................ B01F 11/0258
                                                 134/1
3,160,138 A * 12/1964 Platzman ........... B01D 19/0078
                                                 116/137 A
(Continued)

FOREIGN PATENT DOCUMENTS

CA    2361078        8/2000
CA    2361078 A1 *  8/2000 ........... B01D 9/0036
(Continued)

OTHER PUBLICATIONS

"Effects of ultrasonic vibrations—heat and cavitation", Feb. 18, 2008, Power Ultrasonics http://www.powerultrasonics.com/content/effects-ultrasonic-vibrations-heat-and-cavitation.
(Continued)

*Primary Examiner* — Viet Le
(74) *Attorney, Agent, or Firm* — Greenblum & Bernstein, P.L.C.

(57) ABSTRACT

A generating method for generating one of mist and fine-bubbles or fine-bubbles is provided. The generating method includes arranging a piezoelectric substrate equipped thereon with an excitation source in a liquid, generating a flow of the liquid using a liquid flow generator that generates the flow of the liquid relative to the piezoelectric substrate, exciting a surface acoustic wave on the excitation source, propagating the excited surface acoustic wave so as to generate mist on a gas side and to generate fine-bubbles on a liquid side of the piezoelectric substrate, carrying the generated fine-bubbles away from the piezoelectric substrate
(Continued)

with the generated flow of the liquid, and drawing the liquid containing the fine-bubbles from a liquid container which contains the liquid.

2 Claims, 15 Drawing Sheets

(51) Int. Cl.
| | |
|---|---|
| B01F 3/04 | (2006.01) |
| B05B 17/06 | (2006.01) |
| B08B 3/10 | (2006.01) |
| B06B 1/06 | (2006.01) |
| H01L 41/09 | (2006.01) |

(52) U.S. Cl.
CPC ........ *B05B 17/0615* (2013.01); *B06B 1/0644* (2013.01); *B08B 3/10* (2013.01); *H01L 41/09* (2013.01); *B05B 17/0607* (2013.01)

(58) Field of Classification Search
USPC ............... 239/4, 102.1; 261/81, DIG. 48
See application file for complete search history.

(56) References Cited

U.S. PATENT DOCUMENTS

| | | | | | |
|---|---|---|---|---|---|
| 3,351,539 | A * | 11/1967 | Branson | ............. | B01F 11/0258 204/157.42 |
| 3,410,765 | A * | 11/1968 | Bodine | ............. | B01B 1/00 203/10 |
| 3,433,461 | A * | 3/1969 | Scarpa | ............. | B05B 17/0615 239/102.2 |
| 3,743,523 | A * | 7/1973 | Bodine | ............. | A23L 3/30 366/108 |
| 3,901,443 | A * | 8/1975 | Mitsui | ............. | B05B 17/0615 239/102.2 |
| 3,918,640 | A * | 11/1975 | Piccino | ............. | B05B 17/0615 128/200.16 |
| 3,970,250 | A * | 7/1976 | Drews | ............. | A61M 11/005 239/102.2 |
| 4,001,650 | A * | 1/1977 | Romain | ............. | A61M 11/005 128/200.16 |
| 5,297,734 | A * | 3/1994 | Toda | ............. | B05B 17/0646 239/102.2 |
| 5,299,739 | A * | 4/1994 | Takahashi | ............. | B05B 17/0638 239/102.2 |
| 5,485,828 | A * | 1/1996 | Hauser | ............. | B05B 17/06 128/200.16 |
| 5,653,852 | A * | 8/1997 | Meng | ............. | B01D 1/16 159/28.6 |
| 5,657,926 | A * | 8/1997 | Toda | ............. | B05B 17/0646 239/102.1 |
| 5,996,903 | A * | 12/1999 | Asai | ............. | A61M 11/005 222/409 |
| 6,102,298 | A * | 8/2000 | Bush | ............. | A47J 37/044 239/102.2 |
| 6,228,273 | B1 * | 5/2001 | Hammonds | ............. | C02F 1/34 210/205 |
| 6,244,576 | B1 * | 6/2001 | Tsai | ............. | F24F 6/02 261/141 |
| 6,732,944 | B2 * | 5/2004 | Litherland | ............. | A61M 11/005 239/102.1 |
| 6,854,662 | B2 * | 2/2005 | Chen | ............. | B05B 17/0646 239/102.1 |
| 6,883,729 | B2 * | 4/2005 | Putvinski | ............. | B05B 17/0615 128/200.14 |
| 7,178,741 | B2 * | 2/2007 | Sheng-Chih | ............. | B05B 17/0638 128/200.14 |
| 7,810,742 | B2 * | 10/2010 | Levi | ............. | A01M 1/205 239/102.1 |
| 7,816,415 | B2 * | 10/2010 | Quapp | ............. | B01F 11/0258 518/700 |
| 7,954,486 | B2 * | 6/2011 | Papania | ............. | A61M 15/0065 128/200.14 |
| 8,122,880 | B2 * | 2/2012 | Noolandi | ............. | A61M 11/005 128/200.14 |
| 8,353,466 | B2 * | 1/2013 | Hsieh | ............. | B05B 17/0607 239/102.2 |
| 8,544,826 | B2 * | 10/2013 | Ediger | ............. | F24F 6/12 261/30 |
| 8,684,980 | B2 * | 4/2014 | Hunter | ............. | A61B 5/0059 604/298 |
| 2002/0194855 | A1 * | 12/2002 | Hozumi | ............. | B01F 3/0407 62/69 |
| 2002/0194885 | A1 * | 12/2002 | Chen | ............. | D06B 3/28 68/177 |
| 2003/0042629 | A1 * | 3/2003 | Eom | ............. | F24F 6/12 261/81 |
| 2003/0223305 | A1 * | 12/2003 | Halsall | ............. | B01F 11/0258 366/127 |
| 2005/0184168 | A1 * | 8/2005 | Peng | ............. | A61M 15/0085 239/4 |
| 2006/0086819 | A1 * | 4/2006 | Litherland | ............. | A61M 11/005 239/102.1 |
| 2007/0152081 | A1 * | 7/2007 | Chou | ............. | B05B 17/0646 239/102.2 |
| 2007/0169775 | A1 * | 7/2007 | Chen | ............. | A61M 11/005 128/200.16 |
| 2007/0224080 | A1 * | 9/2007 | Sparks | ............. | A61L 2/22 422/28 |
| 2008/0245362 | A1 * | 10/2008 | Moessis | ............. | A61M 15/0085 128/200.16 |
| 2008/0265052 | A1 * | 10/2008 | Quan | ............. | B05B 17/0623 239/4 |
| 2009/0023821 | A1 * | 1/2009 | Quapp | ............. | B01F 11/0258 518/700 |
| 2009/0054116 | A1 * | 2/2009 | Hakunti | ............. | A61L 9/14 455/899 |
| 2009/0117241 | A1 * | 5/2009 | Tsuji | ............. | B01F 3/0446 426/460 |
| 2009/0134235 | A1 * | 5/2009 | Ivri | ............. | B05B 17/0646 239/4 |
| 2009/0277971 | A1 * | 11/2009 | Scott | ............. | B05B 17/0607 239/4 |
| 2011/0250978 | A1 * | 10/2011 | O'Neill | ............. | F24C 7/004 472/65 |
| 2012/0018526 | A1 * | 1/2012 | Tiba | ............. | A61K 9/0078 239/4 |
| 2012/0234625 | A1 * | 9/2012 | Laugharn, Jr. | ......... | G10K 11/28 181/140 |
| 2012/0270148 | A1 * | 10/2012 | Norikane | ............. | G03G 9/0806 430/137.1 |
| 2013/0010035 | A1 * | 1/2013 | Norikane | ............. | B41J 2/14233 347/70 |
| 2013/0334335 | A1 * | 12/2013 | Wilkerson | ............. | B05B 17/0607 239/4 |
| 2014/0203099 | A1 * | 7/2014 | Wolfe | ............. | C02F 1/36 239/4 |
| 2014/0263724 | A1 * | 9/2014 | Ovchinnikov | ...... | B05B 17/0615 239/102.2 |

FOREIGN PATENT DOCUMENTS

| | | | |
|---|---|---|---|
| DE | 2612568 A1 * | 9/1976 | ............ B01F 11/008 |
| EP | 0555162 A1 * | 8/1993 | ............... B01F 1/00 |
| GB | 2069355 A * | 8/1981 | ......... B01F 11/0258 |
| GB | 2433708 | 7/2007 | |
| JP | 7-232114 | 9/1995 | |
| JP | 11-63397 | 3/1999 | |
| JP | 11-114467 | 4/1999 | |
| JP | 2003-265939 | 9/2003 | |
| JP | 2008-104974 | 5/2008 | |
| JP | 4118939 | 5/2008 | |
| WO | 03/024618 | 3/2003 | |
| WO | 2005/087359 | 9/2005 | |
| WO | WO-2005087359 A1 * | 9/2005 | ............ B01F 11/004 |
| WO | 2009/001950 | 12/2008 | |

(56) References Cited

FOREIGN PATENT DOCUMENTS

| WO | WO-2009001950 A1 | * | 12/2008 | .......... | B01F 11/0258 |
| WO | WO-2009122394 A2 | * | 10/2009 | .......... | B01F 3/04106 |
| WO | WO-2010150629 A1 | * | 12/2010 | .......... | B01F 3/04978 |

OTHER PUBLICATIONS

"Ultrasonic Principle Operation", Stulz. http://www.stulz-ats.com/products/ultrasonic-humidification/stulz-direct-room-drh-ultrasonic-humidifiers/ultrasonic-operating-principle/.
Extended European Search Report for EP 10791947.4 dated Sep. 10, 2015.

* cited by examiner (a)

(b)

(a)

(b)

(a)

(b)

GENERATING METHOD AND GENERATOR FOR GENERATING MIST OR FINE-BUBBLE BY USING SURFACE ACOUSTIC WAVE

CROSS REFERENCE TO RELATED APPLICATIONS

The present application is a continuation application of U.S. patent application Ser. No. 13/379,358, filed on Dec. 20, 2011, which claims the benefit of Japanese Application No. 2009-148112, filed Jun. 22, 2009, and International Patent Application No. PCT/JP2010/059319, filed Jun. 2, 2010. The disclosure of each of these documents, including the specification, drawings, and claims, is incorporated herein by reference in its entirety.

TECHNICAL FIELD

The present invention relates to method and generator which generate mist or fine-bubble of a micro-meter or nanometer order.

BACKGROUND ART

To generate fine bubbles of diameter of a nanometer order below a micron, conventionally, a turning stream is generated in a gas and liquid mixing fluid, and the gas contained in the liquid is subdivided with a shear force produced in the liquid. For example, an equipment is known which supplies a gas and liquid mixing fluid into a cylinder from an inner circumference tangential direction with a vortex pump and then miniaturizes bubbles during revolutions within the cylinder (for example, refer to Japanese patent No. 4118939).

Moreover, a phenomenon is known that if a liquid is supplied to a surface, of a substrate consisting of the piezoelectric material etc., on which a surface acoustic wave is propagating, the liquid receives an energy of the surface acoustic wave, flows or vibrates, and flies as fine particles. Generators which atomize a liquid by using this phenomenon are proposed variously, and a method is known which atomizes a liquid drop by breathing out the drop from an ink jet unit and supplying the drop onto a surface where a surface acoustic wave is propagating (for example, refer to Japanese Laid-open Patent Publication Hei 11-114467).

However, a pump for highly pressurizing a liquid, and so on, are necessary in the generating method of the fine bubbles shown in the Japanese patent No. 4118939 mentioned above, and the miniaturization of apparatus is difficult. Moreover, in the generating method of mist shown in the Japanese Laid-open Patent Publication Hei 11-114467, it is necessary to stably supply the drop to be atomized with sufficient accuracy, and a constitution becomes complicated. Moreover, such a method or a generator is not known which can miniaturize the equipment and can simultaneously generate both of mist and fine-bubble of nanometer order or can generate only desired one.

DISCLOSURE OF THE INVENTION

The present invention is to solve the above problem, and an object of the present invention is to provide a generating method and a generator of mist or fine-bubble, which can stably generate mist or fine-bubble, or both, with a simple and small configuration, by using surface acoustic wave.

A generating method for generating mist or fine-bubble, comprises the steps of: arranging in a liquid a part of a piezoelectric substrate having a surface, said surface intersecting a mutual interface of gas and the liquid and equipped thereon with an excitation means consisting of a plurality of electrodes to excite surface acoustic wave; exciting a surface acoustic wave on the surface with the excitation means; and propagating the excited surface acoustic wave along the surface so that the surface acoustic wave to exist in the upper and lower sides of the interface and the surface acoustic wave to generate mist in the gas side upon the wave being above the interface and to generate fine-bubbles in the liquid side upon the wave being below the interface.

According to such constitution, mist or a fine-bubble can be generated in space-saving and low cost by a simple and small configuration without being based on mechanical operation of generating a turning stream, since generating of mist and generating of a fine-bubble both of which are performed with the surface acoustic wave by using one piezoelectric substrate. Moreover, since the constitution is simple, it is applicable to a various kinds of liquid.

A generator for generating mist or fine-bubble at an interface of gas and a liquid or within the liquid, comprises: a piezoelectric substrate equipped with an excitation means on a surface thereof, the excitation means consisting of a plurality of electrodes to excite a surface acoustic wave; and a substrate-holder holding the substrate, dipping in the liquid a part of the substrate so that the surface to intersect the mutual interface of the gas and the liquid, and a surface acoustic wave excited on the surface of the piezoelectric substrate existing in the upper and lower sides of the interface and propagating along the surface from the gas side to the liquid side.

According to such constitution, since it is enough to provide a piezoelectric substrate so that the substrate intersects a gas-liquid interface, a generator for the mist or the fine-bubbles of a simple and small configuration can be offered. Moreover, since constitution and the principle are simple, there are few restrictions of liquid selection and it is applicable to a various kinds of liquid.

DESCRIPTION OF THE PREFERRED EMBODIMENTS

Hereafter, generating method and generator for generating mist or fine-bubble by using surface acoustic wave, according to the embodiments of the present invention, are described with reference to the drawings.

First Embodiment

Figure 1:
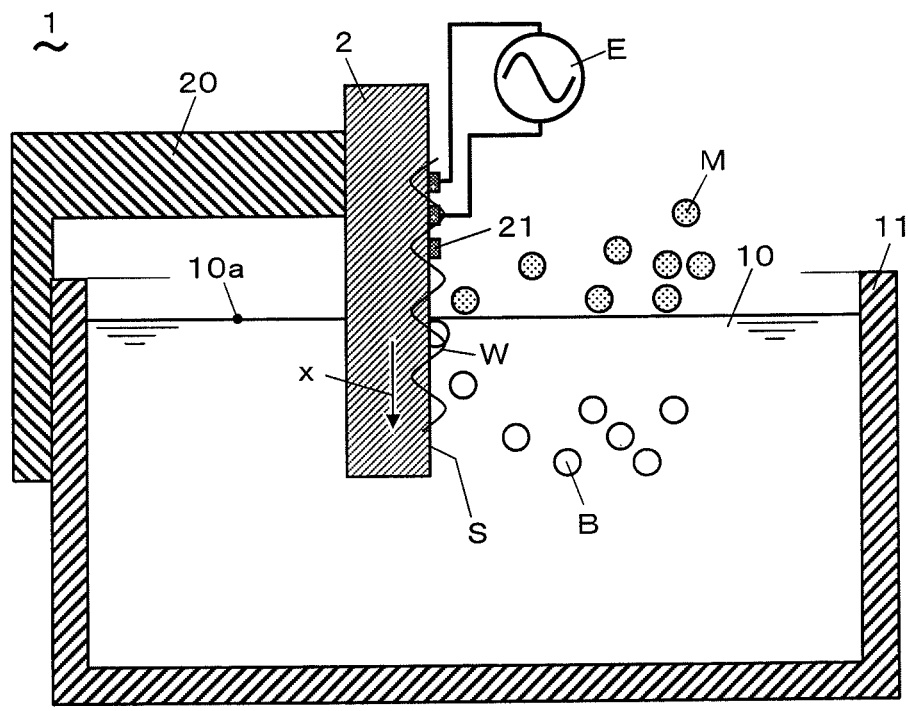
FIG. 1 is a cross-sectional view of a generator for the mist or the fine-bubbles showing a generating method of the mist or the fine-bubbles according to a first embodiment of the present invention.
Figure 2:
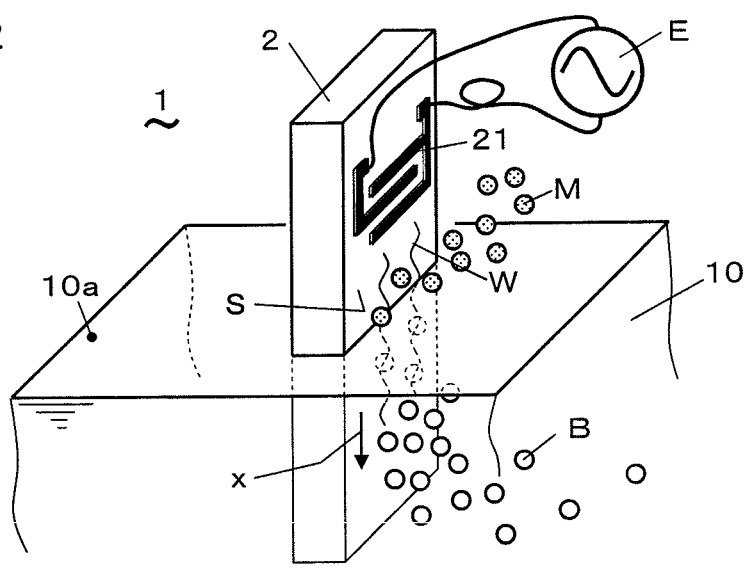
FIG. 2 is a perspective view of the generator.
Figure 3:
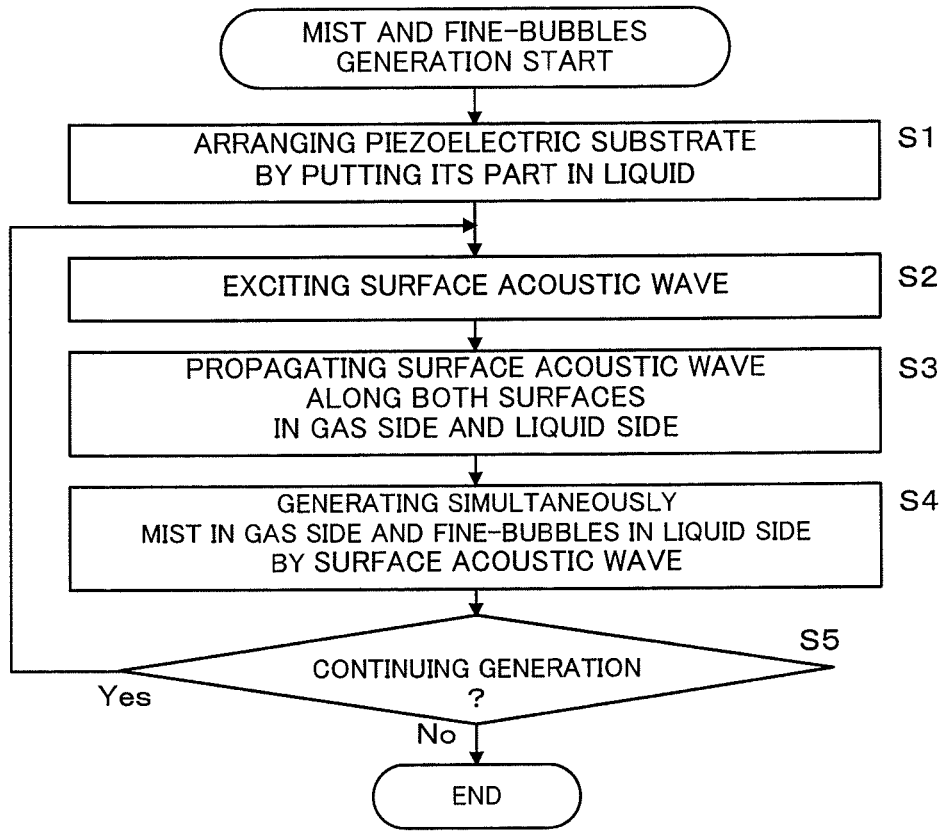
FIG. 3 is a flow chart showing the procedure of the method.

FIG. 1, FIG. 2, and FIG. 3 show the first embodiment. As shown in FIG. 1 and FIG. 2, a generator 1 for generating a mist or fine-bubbles (henceforth the generator 1) is a device provided with a piezoelectric substrate 2 which has a plurality of comb-like electrodes 21 on a surface S to excite a surface acoustic wave W and a part of the piezoelectric substrate 2 is arranged in a liquid 10 so that the surface S intersects a mutual interface 10a (liquid level) of gas and the liquid 10, and the generator 1 excites the surface acoustic wave W with the electrodes 21 on the surface S, propagates the surface acoustic wave W along the surface S so that the surface acoustic wave S exists in the upper and lower sides of the interface 10a, and the surface acoustic wave W generates the mist M in the upper side which is in the gas side, and generates the fine-bubbles B in the lower side which is in the liquid side. The liquid 10 is put in a liquid container 11. Hereafter, detailed description of each constitution is carried out.

The piezoelectric substrate 2 is a rectangular plate, and is vertically held by a substrate-holder 20 so that the longitudinal direction of the plate is in up-and-down direction and a part of it is inserted into the liquid 10. The piezoelectric substrate 2 is a substrate which consists of a piezoelectric crystal itself like $LiNbO_3$ (lithium niobate), for example. Moreover, the piezoelectric substrate 2 can be made of a non-piezoelectric substrate having a piezoelectric thin film, such as PZT thin film (lead, zirconium, titanium-alloy thin film), for example, on its surface, and the surface acoustic wave W is excited on a surface of the piezoelectric thin film covering the surface of the non-piezoelectric substrate. Consequently, the piezoelectric substrate 2 is enough to be a substrate having on its surface the piezoelectric part where the surface acoustic wave can be excited. Moreover, its form is not limited to a rectangle, and it may be arbitrary as the piezoelectric substrate 2 of the generator 1. Moreover, the surface S is not restricted to be flat, but can be made into a surface with arbitrary curved surfaces. The piezoelectric substrate 2 is not restricted to be a plate of constant thickness, but can be of an arbitrary form and is enough if it is equipped with the surface S which can propagate a surface acoustic wave W.

The comb-like electrodes 21 make up an electrode (an intersection finger electrode, IDT: interdigital transducer) by combining two comb shape electrodes each having an opposite polarity. Each of comb teeth of the electrodes 21 are adjacent mutually to belong to different electrodes of different polarity and are arranged at a pitch of half length of a wavelength of a surface acoustic wave W to be excited. By impressing high frequency (for example, MHz band) voltage from an electric circuit E which is dedicated to the high-frequency voltage impression between the electrodes of different polarity of the electrodes 21, an electrical energy is converted into a wave mechanical energy by the comb shape electrodes, and the surface acoustic wave W is excited on the surface S of the piezoelectric substrate 2. An amplitude of the excited surface acoustic wave W is decided by the size of the voltage impressed to the electrodes 21. A length of wave packet of the excited surface acoustic wave W corresponds to a length of time the voltage is impressed. The surface acoustic wave W excited by the electrodes 21 becomes a wave having a width corresponding to an overlap width of comb teeth in a pair of comb-like electrodes interdigitating with each other, and propagated in a direction-x perpendicular to the comb teeth. The above surface acoustic wave W has a feature forcing a liquid which exists on the surface S to move in a propagation direction of the surface acoustic wave W.

A surface acoustic wave W being propagated on a solid surface can be easily and stably excited as a wave of high frequency compared with the supersonic wave which generated with a piezoelectric element etc., and is propagated inside of a solid or fluid in three dimensions. The mist M containing fine particles of a diameter of micron order, or from a submicron to nanometer order can be generated in the gas side by propagating the surface acoustic wave W of short wave length and high frequency into the liquid 10, in the gas-liquid interface 10a where the surface acoustic wave W passes on, and moreover, the fine-bubbles B of a diameter of micron order, or from a submicron to nanometer order can be generated within the liquid 10 by the surface acoustic wave W propagated into the liquid side. According to the constitution of the generator 1, the mist M and the fine-bubbles B can be generated simultaneously.

It is thought that the fine-bubbles B is generated from the gas which is dissolved in the liquid 10. Then, it can be made easy to generate the fine-bubbles by dissolving beforehand the gas which serves as fine-bubbles into the liquid in a supersaturated state. It can be done also to maintain the temperature of the liquid 10 low by providing a cooler for cooling the liquid 10 in order to increase a dissolving capacity of the gas. Moreover, it is thought that the surface acoustic wave W, being propagated from the gas side to the liquid 10 side and passing through the gas-liquid interface 10a, makes involvement of the gas into the liquid from the gas side, and thus it is thought that the fine-bubbles B are generated also from the involved-in gas.

Water, such as tap water and pure water, and liquids such as organic solvents, for example alcohol, and other arbitrary liquid can be used for the liquid 10. However, when insulation protection has not fully been performed to the electrodes 21, the liquid 10 is restricted to the liquid of electrical insulation properties. Then, an insulating layer or a protective layer can be prepared on the surface of the piezoelectric substrate 2 for the electrical insulation of the electrodes 21 or for the corrosion prevention of the piezoelectric substrate 2. As for these, it is desirable not to cause the propagation loss of the surface acoustic wave W. Simple substance gas, such as oxygen and ozone, and desired arbitrary gas other than air in atmospheric air can be used for the gas.

As shown in FIG. 3, the mist M and the fine-bubbles B can be simultaneously generated in a simple procedure. That is, the piezoelectric substrate 2 is arranged so that a part of the substrate is put in the liquid 10 (#1), and the surface acoustic wave W is excited (#2). The surface acoustic wave W is made to propagate along the surface S of the gas side and the surface S of the liquid 10 side (#3). Then, the mist M is generated in the gas side near the gas-liquid interface 10a with the surface acoustic wave W propagating in the gas side, and the fine-bubbles B is generated in the liquid 10 with the surface acoustic wave W propagating in the liquid 10 (#4). Hereafter, while generating the mist M and the fine-bubbles B, the above-mentioned steps are repeated (#1-#4).

According to this embodiment, since generating of the mist M and generating of the fine-bubbles B both are performed by the one piezoelectric substrate 2, the mist M and the fine-bubbles B can be generated in simple and small configuration, space-saving, and at low cost. Moreover, since the constitution is simple, it is applicable to a various kinds of liquid.

Figure 4:
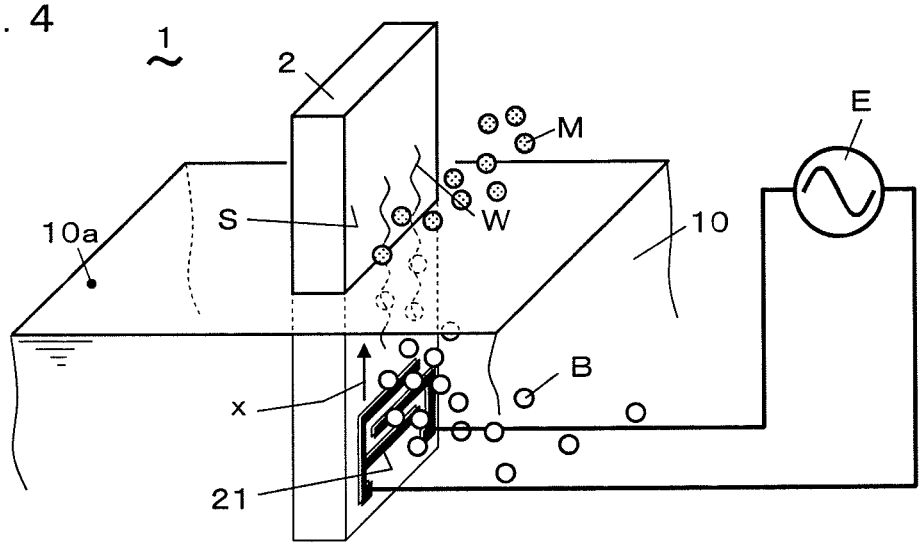
FIG. 4 is a perspective view showing a modification of the generator.
Figure 5:
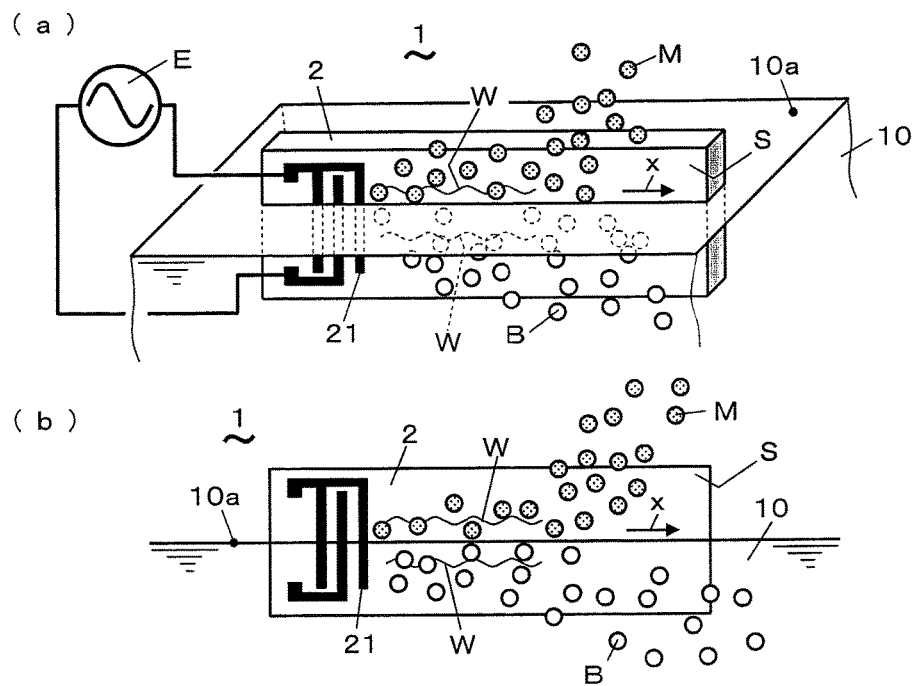
FIG. 5 (*a*) is a perspective view showing another modification of the generator, and FIG. 5 (*b*) is a side view.

FIG. 4 and FIG. 5 show the modification of the first embodiment. As shown in FIG. 4, the piezoelectric substrate 2 can be arranged in a state putting the electrodes 21 in the liquid 10. The electrodes 21 is assumed that electrical insulation of each the electrodes 21 is carried out, or the liquid 10 has a insulation properties, and no problem of a short circuit in the liquid. In the case of this modification, the surface acoustic wave W passes through the gas-liquid interface 10a from the inside of the liquid 10 to the gas side along the surface S and propagates in the gas side. When the wave passes through the gas-liquid interface 10a, instead of involvement of the gas mentioned above, winding up of the liquid 10 up to the gas side occurs. By winding up of such a liquid, the generating efficiency of the mist M can be improved compared with the case of FIG. 1.

Moreover, as shown in FIGS. 5 (a) and (b), the direction of movement (direction-x) of the surface acoustic wave W in the piezoelectric substrate 2 can also be arranged in parallel with the gas-liquid interface 10a. In such constitution, the mist M and the fine-bubbles B are generated more stably, since the mist M and the fine-bubbles B receive driving force in the propagation direction of the surface acoustic wave W. That is, it is because the mist M and the fine-bubbles B go off from around the piezoelectric substrate 2 generation after generation, and go promptly apart respectively and mutually, so annihilation of the fine-bubbles B caused by joining together, for example, is inhibited. In addition, the angle between the direction (direction-x) of propagation of the surface acoustic wave W and the gas-liquid interface 10a (in other words, posture of the piezoelectric substrate 2 related with a rotation angle around an axis vertical to the surface S) can be made not only into the above right angle direction or a parallel direction but into arbitrary angles. Moreover, this angle can be made to fluctuate suitably while using the generator 1 by providing an angle changer. By this angle change, the gas can be involved in into the liquid, or the liquid can be conversely wound up in the gas, and the generating ratio of the mist M and the fine-bubbles B can be fluctuated dynamically.

Figure 6:
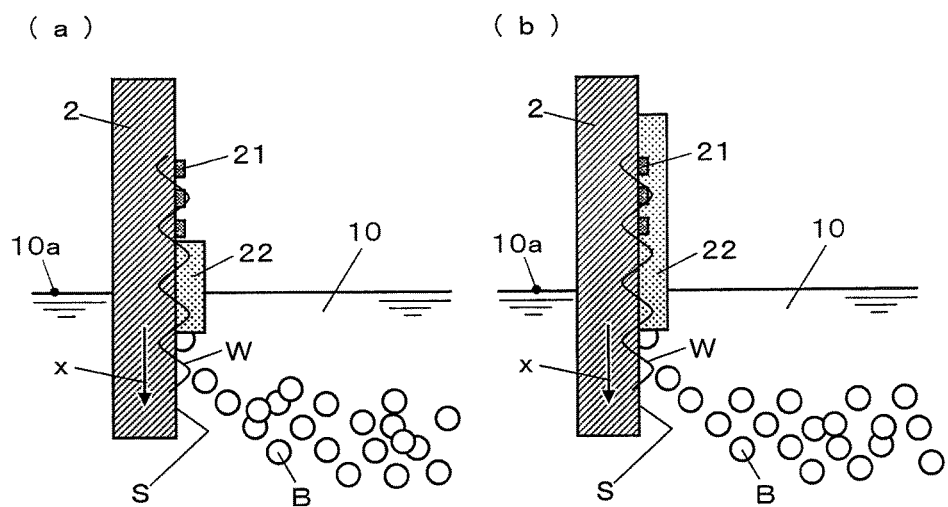
FIGS. 6 (*a*) and (*b*) are cross-sectional views of generators showing generating methods for the fine-bubbles according to other modifications of the first embodiment.

FIGS. 6 (a) and (b) show other modifications of the first embodiment. As shown in FIG. 6 (a), this modification is provided with a cover 22 which is sticking on the surface S at a region including at least an intersection region in the piezoelectric substrate 2 of the first embodiment that has arranged the electrodes 21 in the gas side. The generator 1 can generate the fine-bubbles B in the inside of the liquid 10 which is away from the interface 10a, without generating the mist M, by propagating the surface acoustic wave W excited with the electrodes 21 from the gas side along the surface S into the liquid 10. The cover 22 is for the purpose of generating the fine-bubbles B at high efficiency by suppressing the influence of the change of the boundary condition at the time passing the interface 10a, and then by suppressing the propagation loss of the surface acoustic wave W. Therefore, in order to stop the decay of waves in the interface 10a and to secure the oscillating intensity of the surface acoustic wave W in the liquid 10 certainly, the cover 22 shall not cause the propagation loss of the surface acoustic wave W. Material which has a certain amount of elasticity and does not disturb vibration of the piezoelectric substrate 2, or a piezoelectric material equivalent to the piezoelectric substrate 2, can be used as a material of the cover 22.

According to this modification, since the transfer loss of the surface acoustic wave W, which occurs when the surface acoustic wave W propagates from the gas side into the liquid 10 side and passes through the interface 10a, can be suppressed with the cover 22, the fine-bubbles B can be generated with sufficient energy efficiency. Moreover, since the surface acoustic wave W comes into contacts with the liquid 10 inside of the liquid 10 away from the interface 10a, the fine-bubbles B can be generated selectively, without generating mist M. Moreover, since the fine-bubbles B are generated away from the interface 10a, their dissipation into the gas side is reduced.

Moreover, as shown in the modification of FIG. 6 (b), the cover 22 can be provided further to cover the electrodes 21. With this constitution, since the surface acoustic wave W, from the time as it is excited, propagates the surface S which covered with the cover 22, unlike the case of above-mentioned FIG. 6 (a), the surface acoustic wave W does not pass through a boundary between gas and the cove 22, and the loss at a time passing through such a boundary does not occur. That is, according to this modification, since change of the boundary condition at the time the surface acoustic wave W propagating into the liquid 10 is once at the exit-side edge of the cover 22, the transfer loss of the surface acoustic wave W is suppressed further.

Figure 7:
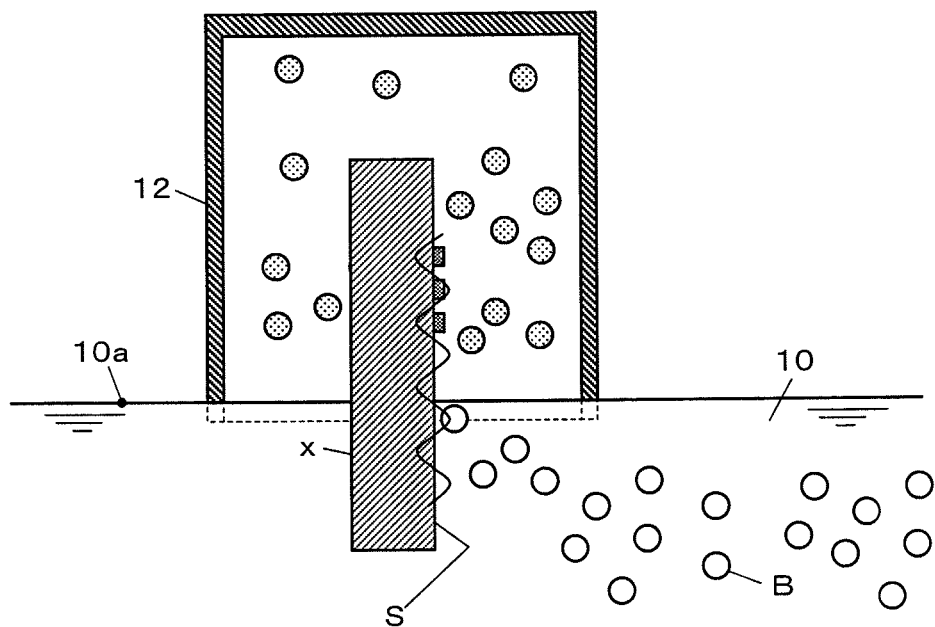
FIG. 7 is a cross-sectional view of a generator showing a generating method for the fine-bubbles according to further another modification of the first embodiment.

FIG. 7 shows further another modification of the first embodiment. This modification confines the mist M in a space formed with a container 12 and the liquid 10 by providing the container 12 which covers a gas side portion of the piezoelectric substrate 2 in the first embodiment. The container 12 need not form a sealing space, but it is sufficient if it can contain the mist M within the limits of desire, and it can be a container having an aperture up, for example. Moreover, when the insulation process of the electrodes 21 is not fully carried out, an exhaust port can be provided to the container 12, or powered exhaust can be done so that the short circuit between the electrodes 21 may not occur with the swarm of the mist M. According to this modification, since the container 12 is provided, the generated mist M does not go outside, and it is possible to use the fine-bubbles B only.

Figure 8:
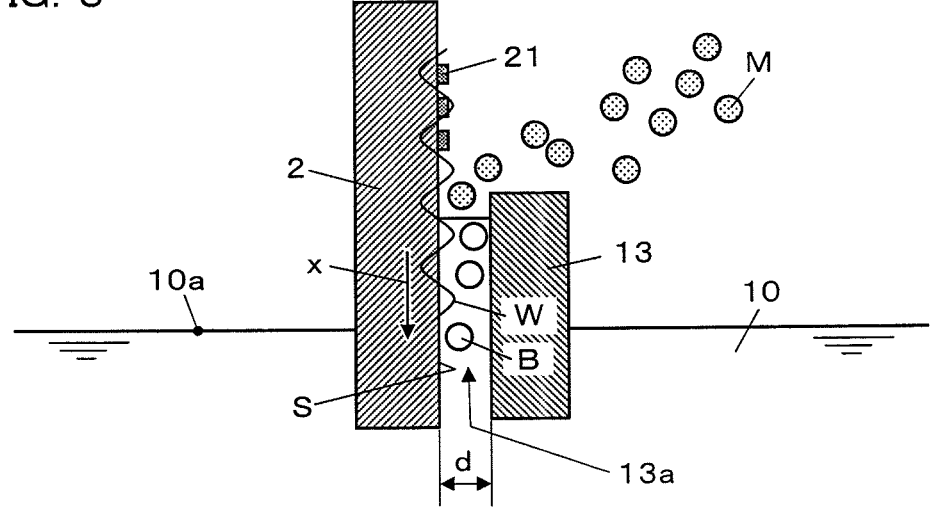
FIG. 8 is a cross-sectional view of a generator showing a generating method for the mist according to further another modification of the first embodiment.

FIG. 8 shows further another modification of the first embodiment. This modification is provided, in the first embodiment, with a plate 13 which approaches and faces the surface S of the piezoelectric substrate 2 at a position intersecting the interface 10a. The plate 13 is a rectangular plate with horizontal top and lower hems, for example. The plate 13 raises the height of the level of the liquid 10, namely the gas-liquid interface 10a, in the gap between its surface and the surface S of the piezoelectric substrate 2 with surface tension (there is also a liquid to which a liquid level is dropped depending on the situation of the kind of liquid 10, or a liquid touching face, and so on). Here, in order to set up the gap d of the surface S and the plate 13, height H of the top hem of the plate 13 from the interface 10a, the surface tension T of the liquid 10, the contact angle φ, the density ρ, and the gravitational acceleration g are given. From these values, gap d0=2T cos φ/(ρgH) is calculated, and the gap d of the piezoelectric substrate 2 and the plate 13 is set as less than gap d0 (d<d0).

The generation of the fine-bubbles B, towards the exterior (lower part) from a space between the piezoelectric substrate 2 and the plates 13, is stopped by arranging the plate 13 in front of the surface S with the gap d above-mentioned. This is based on the phenomenon that the fine-bubbles B stop appearing in the downward liquid 10, since each of the fine-bubbles B generated in the liquid of the space between the piezoelectric substrate 2 and the plate 13 combines together and comes up if the height H of the top hem of the plate 13 becomes beyond a certain constant value. Since the height H is set as upper height from the interface 10a, if the plate 13 is extended in a lower part from the interface 10a, the fine-bubbles B stops appearing below even if the height of the plate 13 is lower than above-mentioned height H.

According to this modification, the generation of the fine-bubbles B is suppressed inside of the liquid 10 and only the mist M can be generated to the exterior, since the movable space for the fine-bubbles B is limited in the gap d by making the gap d between the piezoelectric substrate 2 and the plate 13 narrow enough, and each of the fine-bubbles B combines and goes upwards. In such gap d, the mist M can be generated stably in a same height position to the piezoelectric substrate 2, since the height of the level rises than other portions and is kept with the surface tension of the liquid 10, even if the height of the level of other portions changes.

Figure 9:
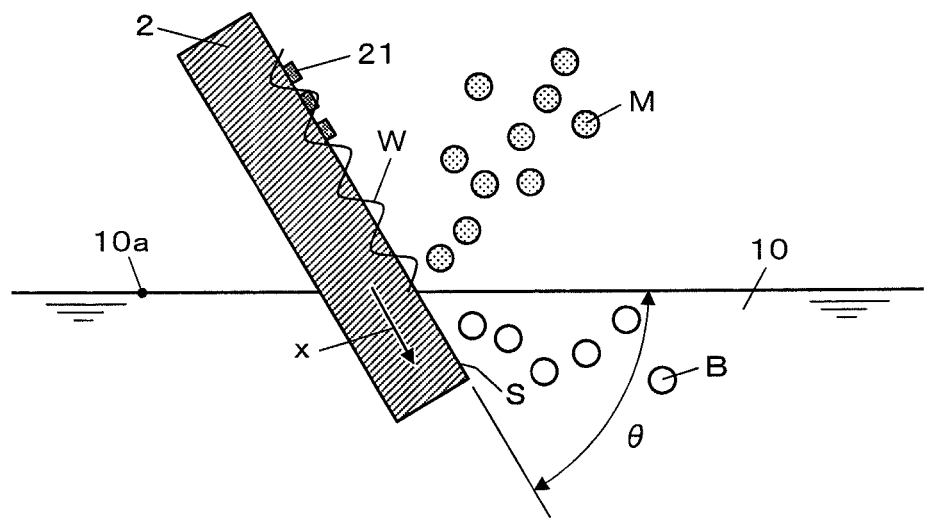
FIG. 9 is a cross-sectional view of a generator showing a generating method for the mist and the fine-bubbles according to further another modification of the first embodiment.

FIG. 9 shows further another modification of the first embodiment. This modification changes the generation ratio of the mist M or the fine-bubbles B in the first embodiment by changing the angle θ of intersection between the surface S and the interface 10a. According to such constitution, since the space surrounded by the interface 10a and the surface S of the piezoelectric substrate 2 can be changed in the gas side and the liquid 10 side respectively by changing the angle θ of the intersection, for example, in the range of 0<θ<π, the amount of emergence of the mist M and the fine-bubbles B or the generation ratio of the mist M and the fine-bubbles B can be changed. For example, if the angle θ in a figure becomes small, the surface S becomes upward more and the surface S and the interface 10a become closer to parallel, the space by the side of the liquid 10 will become narrow, and it will become easy to combine between the fine-bubbles B, and the fine-bubbles B will come to decrease in number as a result. In this case, since the space by the side of the gas becomes large, and since the liquid 10 spreads thinly on the surface S and it becomes easy to generate the mist M, the generating efficiency of the mist M will increase. Moreover, conversely, if the angle θ in a figure becomes large, it will become reverse operation. An angle θ can be beforehand set up manually before use of the generator 1, and can be dynamically changed automatically according to an operating condition while in use. The mechanism to change the angle θ is easily incorporable into the substrate-holder 20 by using a circular slotted hole etc. to carry out variable movement or by combining a motor. Moreover, although the angle θ of intersection between the surface S and the interface 10a is shown in this modification, it is also possible to make the ratio change in combination with an angle of rotation around the axis vertical to the surface S (see FIG. 5 and its explanation).

Figure 10:
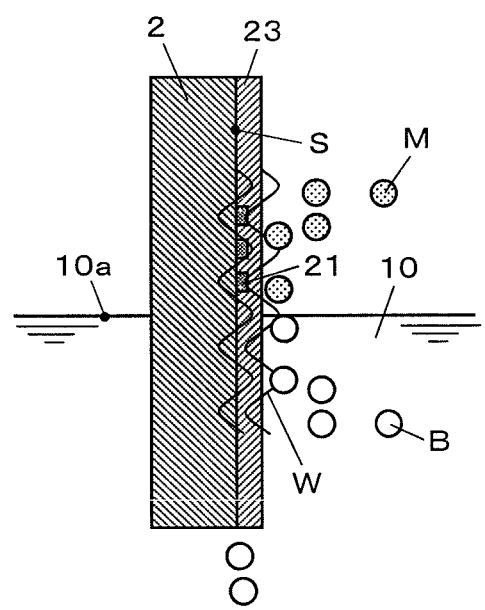
FIGS. 10 (a) and (b) are cross-sectional views of generators showing generating methods for the mist and the fine-bubbles according to further other modifications of the first embodiment.
Figure 10:
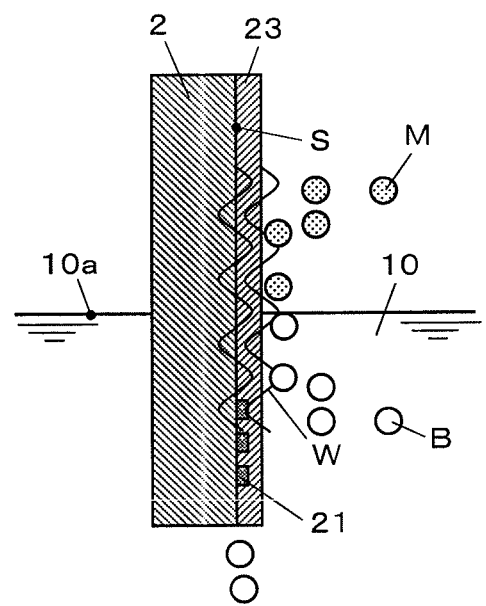

FIGS. 10 (a) and (b) shows further other modification of the first embodiment. As shown in FIG. 10 (a), this modification is what the surface S of the piezoelectric substrate 2 in the first embodiment is covered by an insulator 23 so that the excitation means 21 is covered at least. The insulator 23 consists of hard materials such that the surface acoustic wave W is not absorbed. Such insulator 23 is provided by joining a piezoelectric material equivalent to the piezoelectric substrate 2, for example, a lamina of $LiNbO_3$ (lithium niobate), or other insulating materials, for example, a lamina of a silicon substrate, and so on. Moreover, a piezoelectric thin film, such as PZT, can be formed on the surface S as the insulator 23, instead of joining a lamina. The insulator 23 is set to have a thickness so that the surface acoustic wave W can propagate on its outside surface. Moreover, it is not necessary for the insulator 23 to cover the whole of the surface S, and when insulating only the portion of the electrodes 21, it is not necessary for the thickness of the insulator 23 to be of the thickness that the surface acoustic wave W can propagates on its outside surface.

According to this modification, the mist M and the fine-bubbles B can be generated stably even if the liquid is conductive, since the electrodes 21 for constituting an excitation means is insulated. Moreover, since the electrodes 21 is equipped with the insulator 23, an unexpected situation of an accidental connection between the electrodes can be avoided, and the mist M and the fine-bubbles B can be easily generated with easy operation. Moreover, as shown in FIG. 10 (b), the piezoelectric substrate 2 can also be arranged in a state that the electrodes 21 of the piezoelectric substrate 2 is dipped into an electro-conductive liquid.

Figure 11:
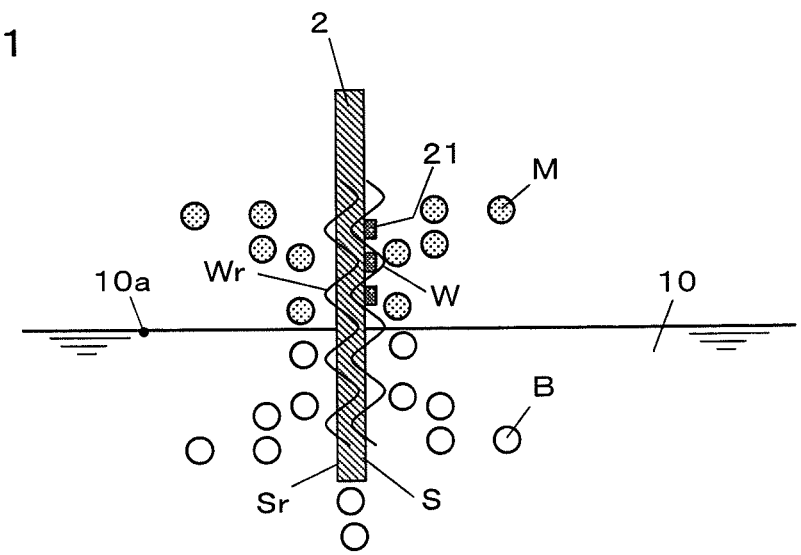
FIG. 11 is a cross-sectional view of a generator showing a generating method for the mist and the fine-bubbles according to further another modification of the first embodiment.
Figure 12:
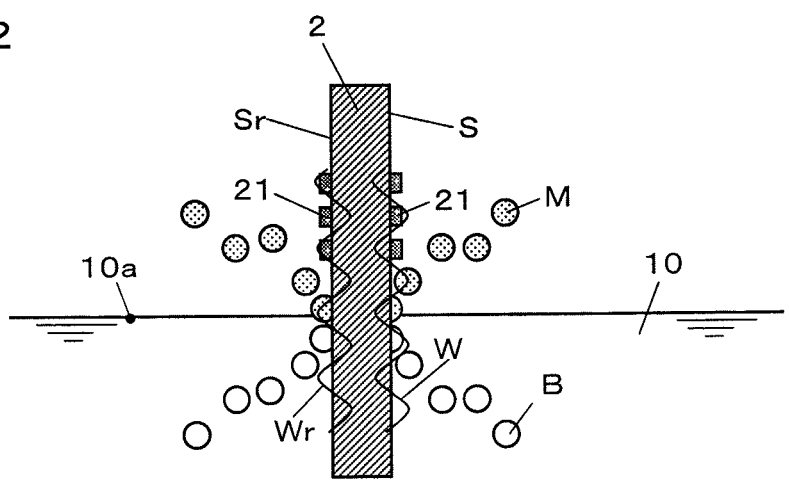
FIG. 12 is a cross-sectional view of a generator showing a modification of the method.
Figure 13:
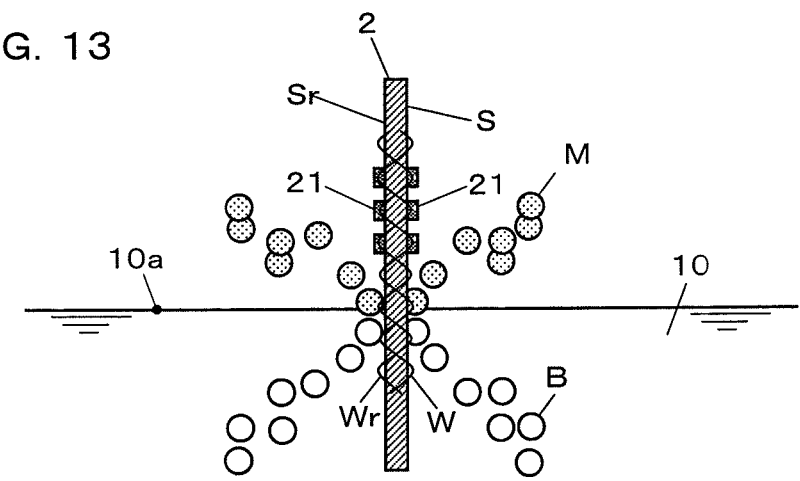
FIG. 13 is a cross-sectional view of a generator showing another modification of the method.

FIG. 11, FIG. 12, and FIG. 13 show further other modifications of the first embodiment. The modification shown in FIG. 11 is what the substrate-thickness of the piezoelectric substrate 2 in the first embodiment is made thin so that a surface acoustic wave Wr can propagate on a rear-surface Sr which counters the surface S, while the surface acoustic wave W excited by the electrodes 21 propagates the surface S. What is necessary is just to make thickness of the piezoelectric substrate 2 thinner than one fourth of the wave length of the surface acoustic wave W, for example. Piezoelectric thin films, such as PZT, can be used as the piezoelectric substrate 2. Such thin piezoelectric substrate 2 can be used as the stably usable generator by providing a circumference reinforcement part which holds the circumference like a frame. A piezoelectric substrate formed in such a diaphragm structure can be formed by using an etching technology for the silicon substrate, and so on. According to this modification, the mist M and the fine-bubbles B can be generated on both the surface S and rear-surface Sr, and more mist M and fine-bubbles B can be generated efficiently.

Moreover, as shown in FIG. 12, the piezoelectric substrate 2 is equipped with electrodes 21 as an excitation means on the surface S and on a rear-surface Sr which counters the surface S, and the surface acoustic waves W and Wr can be excited on these both surface S and Sr. This modification, unlike what was shown in FIG. 11, does not have to make the thickness of the piezoelectric board 2 thin, and can make it arbitrary thickness. Moreover, connection wiring with the electric circuit E for high-frequency voltage impression can be collected on one side by connecting the electrodes 21 of the same polarity of both sides of the piezoelectric substrate 2 by through holes penetrating the piezoelectric substrate 2. According to such a modification, the upper limit of supply power can be increased and more mist M and fine-bubbles B can be generated, since more electric power can be fed by increasing the upper limit of the supply power per piezoelectric substrate.

Moreover, as shown in FIG. 13, the electrodes 21 are formed on both surfaces S and Sr of the piezoelectric substrate 2, respectively, and the surface acoustic waves W and Wr on both surfaces S and Sr can be excited to become in phase mutually. It is also not necessary to make the thickness of the piezoelectric substrate 2 thin for this modification, unlike what was shown in FIG. 11, thickness can be arbitrary, although the thinner one is suitable. According to such a modification, the electromechanical conversion of an electric power supplied to the electrodes 21 into a wave mechanical energy can be carried out efficiently, and then the surface acoustic waves W and Wr can be excited efficiently and more strongly, and more mist M and fine-bubbles B can be generated, since the electric field distribution in the piezoelectric substrate 2 becomes symmetrical mutually with the surface S and the rear-surface Sr and compression and extension of the piezoelectric substrate 2 are carried out by a cooperating voltage oscillation in the front and the rear.

Figure 14:
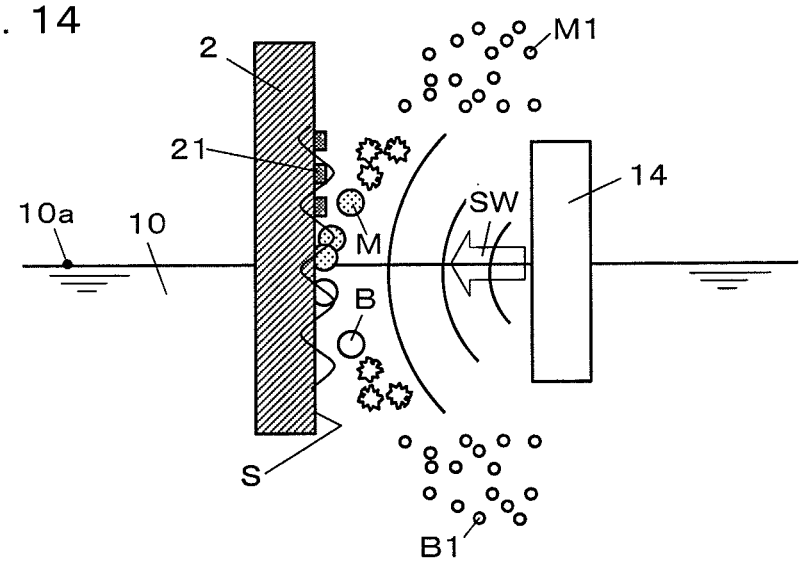
FIG. 14 is a cross-sectional view of a generator showing a generating method for the mist and the fine-bubbles according to further another modification of the first embodiment.

FIG. 14 shows further another modification of the first embodiment. This modification is what a shock wave generator 14 is provided at a position which counters the surface S of the piezoelectric substrate 2 in the first embodiment, and this modification crushes (breaks by applying pressure) the mist M or the fine-bubbles B generated with the surface acoustic wave W with a shock wave SW emitted from the shock wave generator 14, and makes them into mist M1 finer than the mist M, or into fine-bubbles B1 finer than the fine-bubbles B. The shock wave generator 14 can be of any generator which can irradiate the mist M or the fine-bubbles B with the shock wave SW. For example, the piezoelectric substrate 2 itself can be made to serve a double purpose as a shock wave transmitter of the shock wave generator 14, and the shock wave SW is generated and then propagated into the gas and the liquid 10 in front of the surface S. In this case, it becomes unnecessary to install a source of shock wave additionally. Moreover, when sufficient intensity of shock wave SW is not obtained with this combination, a shock wave generator 14 which uses supersonic wave transmitter etc. can be provided further, and the shock waves from both can be impressed. According to this modification, it is possible to make the fine-bubbles B into finer fine-bubbles B1 by simple configuration without the need of any equipment like a fluid motion generator which causes a turning stream. The propagation direction of the shock wave SW is not restricted to the front direction of the surface S, but it can be arbitrary directions of right, left, up, down or slant, as long as the shock wave SW can irradiate the mist M or the fine bubbles B. Moreover, it is enough to irradiate either one of the fog M or a fine bubble B with the shock wave SW. Moreover, in order to concentrate the shock wave SW on a specific focusing position, the transmitter surface can be formed into a curved surface, or a phase control can be carried out for the phases of waves from a plurality of transmitters.

Figure 15:
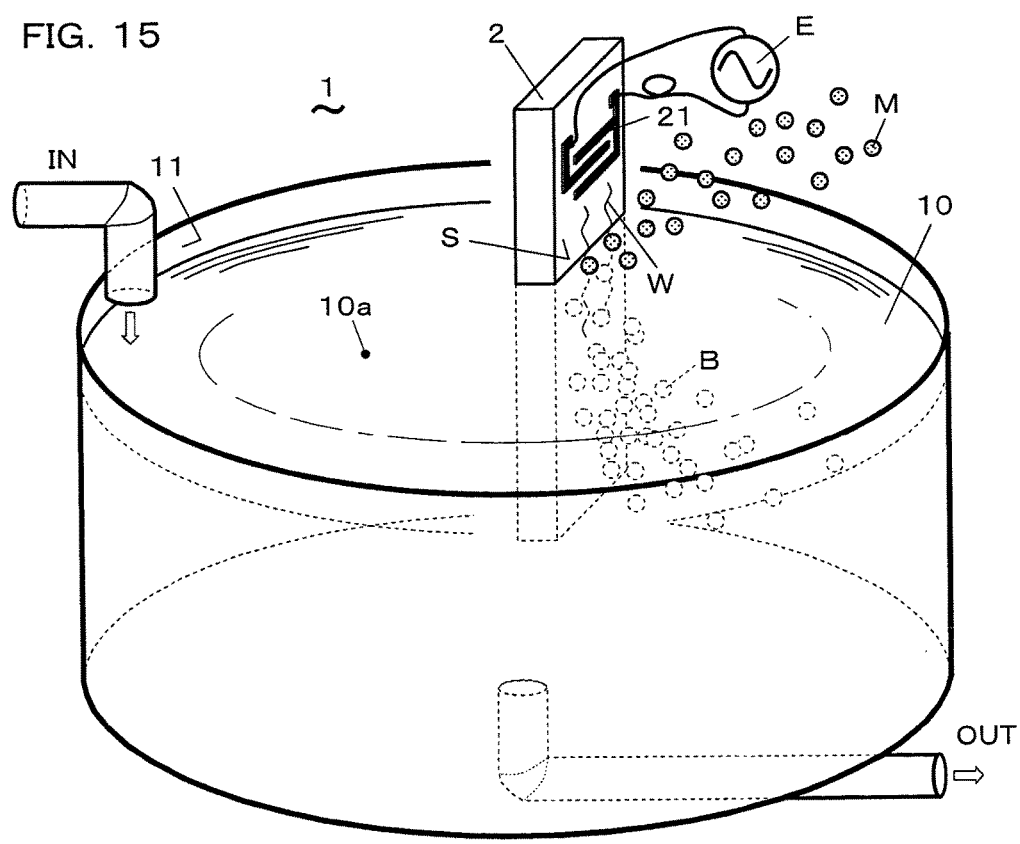
FIG. 15 is a perspective view of a generator showing a generating method for the mist and the fine-bubbles according to further another modification of the first embodiment.
Figure 16:
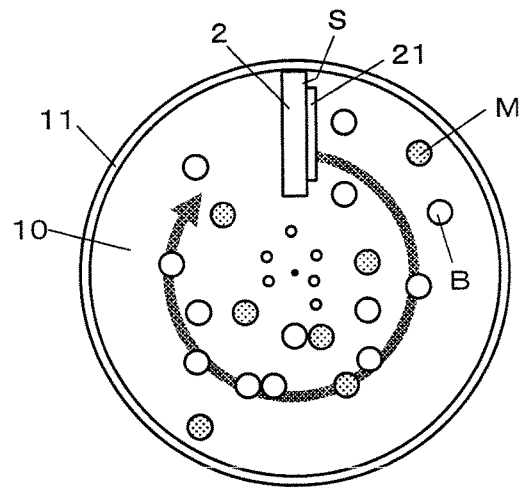
FIG. 16 is a plan view of the generator.

FIG. 15 and FIG. 16 show further another modification of the first embodiment. This modification is what the liquid 10 is put in a liquid container 11 of circle configuration in plan view in the first embodiment. It is desirable that the liquid container 11 has an inner peripheral wall near perfect circle form, when it is seen from a top face, but a form with no corner, which is easy to generate rotating flow, like an ellipsoid, or a rectangle chamfered by C-cut or R-cut is also sufficient. The piezoelectric substrate 2 is arranged in the off-centered position away from the center of such liquid container 11. Moreover, the surface S is parallel to the diameter direction of the liquid container 11, and the generating direction (direction vertical to the surface S) of the mist M and the fine-bubbles B is set in a circumferencial direction. The fine-bubbles B generated under such an arrangement-configuration move along the inner wall of the liquid container 11, and the liquid 10 in the liquid container 11 receives a momentum in a direction along the inner wall, and thus a rotating flow (a kind of convection current) of the circumferencial direction is generated in the liquid container 11. Moreover, the fine-bubbles B in the central part of the liquid container 11 are crushed and turns into finer bubbles by the movement of the liquid 10 caused by the flow of the liquid 10 in a circumferencial direction. In order to promote such rotating flow actively, a stirrer etc. which is rotated by an external motor can be provided in the liquid container 11, or the piezoelectric substrate 2 itself can be moved along the circumferencial direction of the liquid container 11, for example.

In the generator 1, the liquid 10 containing the fine-bubbles B can be drawn from the center of the lower part of the liquid container 11, for example, as the arrow head OUT shows, and the liquid 10 can be used for a washing use, and so on. Moreover, resupply of the liquid can be supplied suitably from the upper part of the liquid container 11, as the arrow head IN shows, in order to compensate the outflow of the liquid 10. At this time, the quantity of the exciting power for the surface acoustic wave, an exciting frequency, the number of electrodes for excitation, propagation area in the piezoelectric substrate 2, and the number of the piezoelectric substrate itself, etc. which are the specifications in connection with the generation performance for the fine-bubbles B, can be set beforehand or changed while in use, so that the fine-bubbles B in the liquid 10 can have a suitable bubble number density according to its utilization object. Moreover, the flow volume of the liquid 10 to be drawn can be changed and adjusted, so that the fine-bubbles B can have a suitable bubble number density.

According to this modification, since it is possible to make the fine-bubbles B go off from vicinity of the piezoelectric substrate 2 and to separate and disperse each of the fine-bubbles B with the flow of the liquid 10 along the circumferencial direction of the circular liquid container 11, it is possible to prevent each of the fine-bubbles B from joining and to suppress an annihilation of the fine-bubbles B which is caused by their growth, and thus efficiently to generate the fine-bubbles B. In addition, it is good also to tilt the piezoelectric substrate 2 from the direction of the diameter of the liquid 10 in plan view and arrange it in the position where the rotational flow of the liquid is not disturbed.

Figure 17:
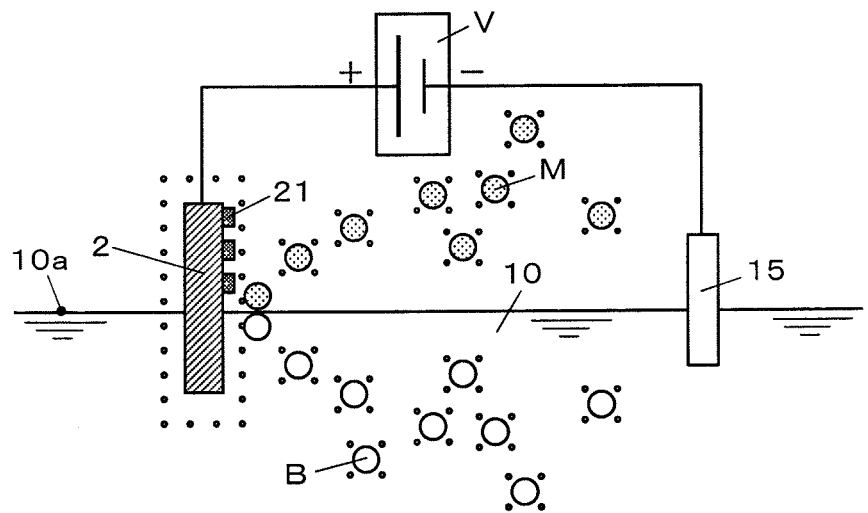
FIG. 17 is a cross-sectional view of a generator showing a generating method for the mist and the fine-bubbles according to further another modification of the first embodiment.
Figure 18:
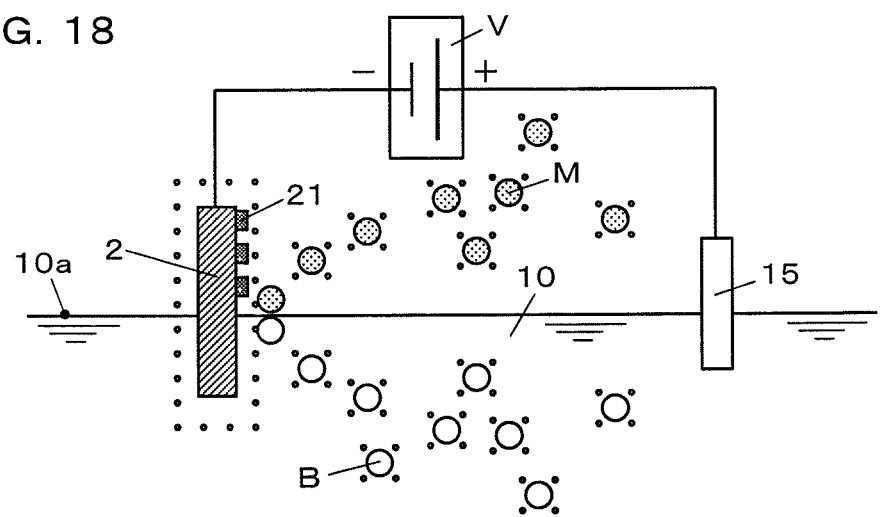
FIG. 18 is a cross-sectional view of a generator showing a modification of the method.

FIG. 17 and FIG. 18 show further other modifications of the first embodiment. The modification shown in FIG. 17 is what a positive voltage is impressed on the piezoelectric substrate 2 in the first embodiment. That is, a counter electrode 15 is provided in the gas and liquid at the position away from the piezoelectric substrate 2, and a voltage from DC power supply V is impressed on between the piezoelectric substrate 2 and the counter electrode 15, and the region in the piezoelectric substrate 2 where the mist M and the fine-bubbles B are generated is made into positive electric potential to ambience. The positive electrode (not shown) which is used for impressing positive voltage on the piezoelectric substrate 2 and vicinity to the counter electrode 15 (negative electrode) is preferably of conductive material possible to have uniform electric potential, such as metal. Moreover, an electrode pattern can be provided as a positive electrode on the surface S of the piezoelectric substrate 2 where the surface acoustic wave W propagates. In this case, the number of parts can be cut down. Moreover, the electrodes 21 can be in common use as a positive electrode. In this case, what is necessary is just to impress high-frequency voltage so that the electrodes 21 may always serve as positive electric potential to the liquid 10. Moreover, the liquid 10 is preferably, in the case of water, for example, not pure water but many ion is contained. In addition, as a modification of this embodiment, when the piezoelectric substrate 2 is arranged by putting the electrodes 21 side into the liquid 10, it is necessary to insulate the electrodes 21.

According to this modification, by making an anion in the liquid 10 (for example, $OH^-$) adhere to the surface of the piezoelectric substrate 2, the mist M, or the fine-bubbles B, and by using the repulsive force between the electric charges of the same kind, it is possible to make the mist M and the fine-bubbles B go off promptly from vicinity of the piezoelectric substrate 2, separate, and disperse the mist M or each of the fine-bubbles B, and thus the combination between the mist M or between each of the fine-bubbles B can be prevented. Therefore, annihilation of the mist M or the fine-bubbles B which is caused by combination growth is suppressed, and it is possible to efficiently generate the mist M or the fine-bubbles B, and to stably maintain the state of the mist M or the fine-bubbles B.

Moreover, as shown in FIG. 18, the electric potential impressed on the piezoelectric substrate 2 can also be made into negative potential. In this case, an equivalent effect as mentioned above is brought out by positive ions in the gas and the liquid 10. Whether positive or negative electric potential is impressed on the piezoelectric substrate 2 can be selectively determined according to the characteristics of the liquid 10, the mist M, or the fine-bubbles B, and the fields of application of these (the use field and the purpose).

Figure 19:
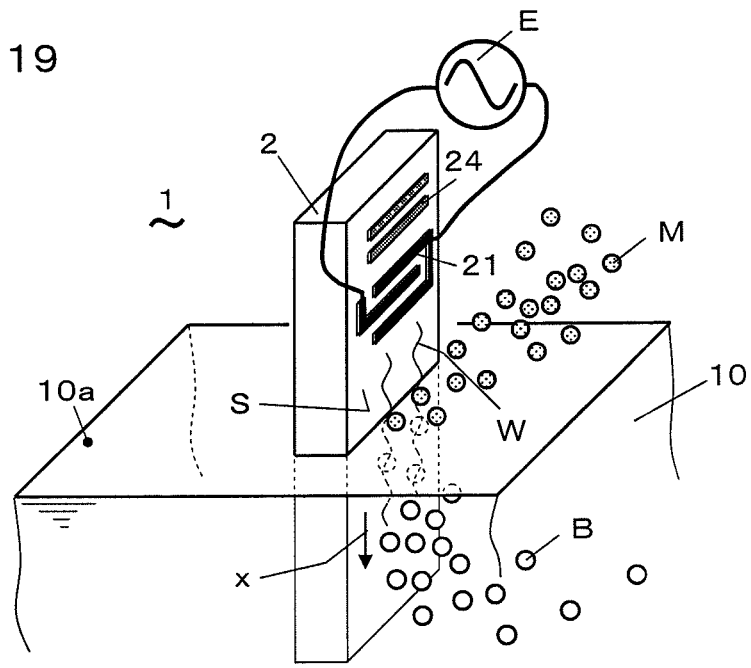
FIG. 19 is a cross-sectional view of a generator showing a generating method for the mist and the fine-bubbles according to further another modification of the first embodiment.
Figure 20:
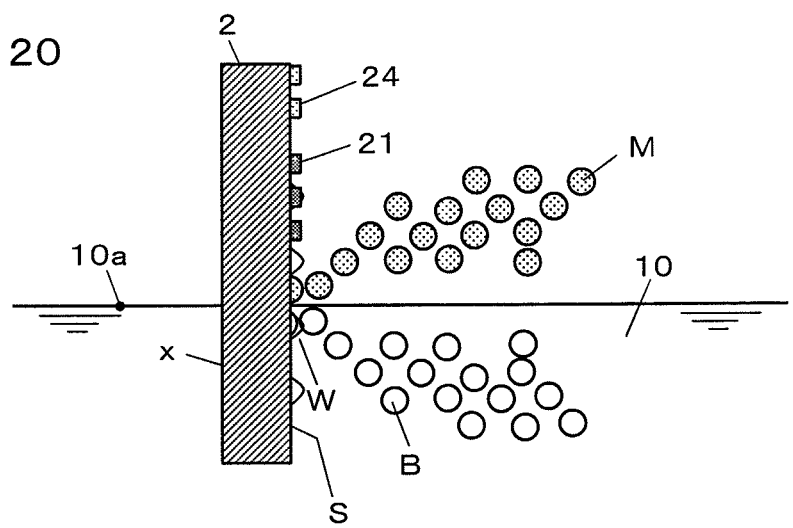
FIG. 20 is a cross-sectional view of the generator.

FIG. 19 and FIG. 20 show further another modification of the first embodiment. This modification is what provided with a reflector 24 as a reflective means on the surface S of the piezoelectric substrate 2 in the first embodiment, in order to reflect one of the surface acoustic waves which are excited with the electrodes 21 and propagate in two reverse directions, and to make both of the surface acoustic waves propagate as a surface acoustic wave W which goes to one way (direction-x in a figure). The reflector 24 can be constituted with comb-like electrodes, and so on as well as the electrodes 21.

According to this modification, the propagation of the surface acoustic wave can be limited in the one direction, and the generation position of the mist M and the fine-bubbles B can be limited. Moreover, the energy of wave can be used effectively, when the piezoelectric substrate 2 is arranged with the electrodes 21 as an excitation means in the gas by reflecting the surface acoustic wave propagating toward the substrate edge in the gas which does not contribute to generating of mist or a fine-bubble at all, and making it go to the liquid 10 side with the reflector 24.

Figure 21:
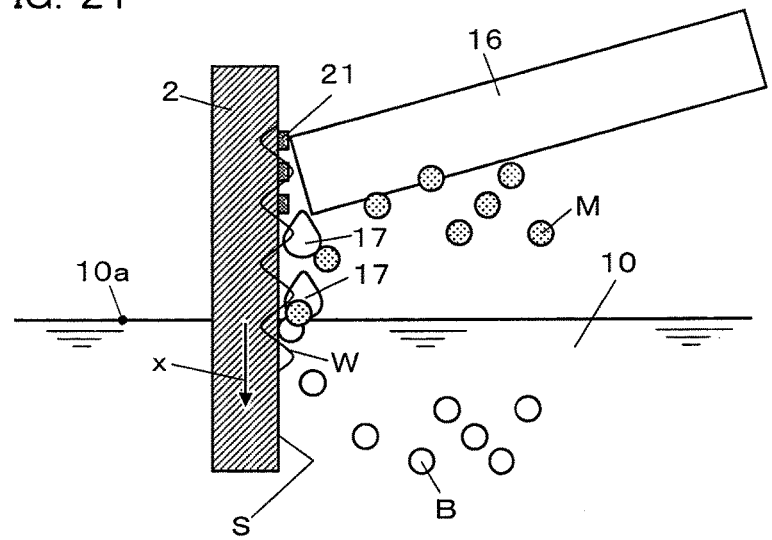
FIG. 21 is a cross-sectional view of a generator showing a generating method for the mist and the fine-bubbles according to further another modification of the first embodiment.

FIG. 21 shows further another modification of the first embodiment. This modification is what provided with a dropping device 16 in the first embodiment, and surface active substances 17 is dropped with the dropping device 16 in a domain where the fine-bubbles B is generated. For the surface active substances 17, detergent for home use etc. can be used, for example. The dropping device 16 is constituted as a device which drops the surface active substances 17 by gravity from a pipe, drops them forcibly with a pump, or sprays them from a spray-nozzle. What is necessary is to arrange the tip of these pipe or spray-nozzle near the intersection of the surface S of the piezoelectric substrate 2 and the interface 10a, to drop or spray and supply the surface active substances 17 to the liquid 10. The liquid 10 is led to a specified position with the fine-bubbles B, and used for washing, disinfection, etc. by piping etc. and is consumed. Then, the amount of supply of the surface active substances 17 can be set up or changed according to the required specification about the flow rate of the liquid 10, the capacity of a liquid container, or the physical properties of the liquid 10, and so on.

According to this modification, generating stabilization of the mist M and the fine-bubbles B can be attained by the physicochemical effect of the surface active substances. Moreover, for example, when using the mist M and the liquid 10 for washing, the surface active substances, which can improve a scavenging effect, can be made to adhere to the surface of the mist M and the fine-bubbles B efficiently in the minimum quantity.

Figure 22:
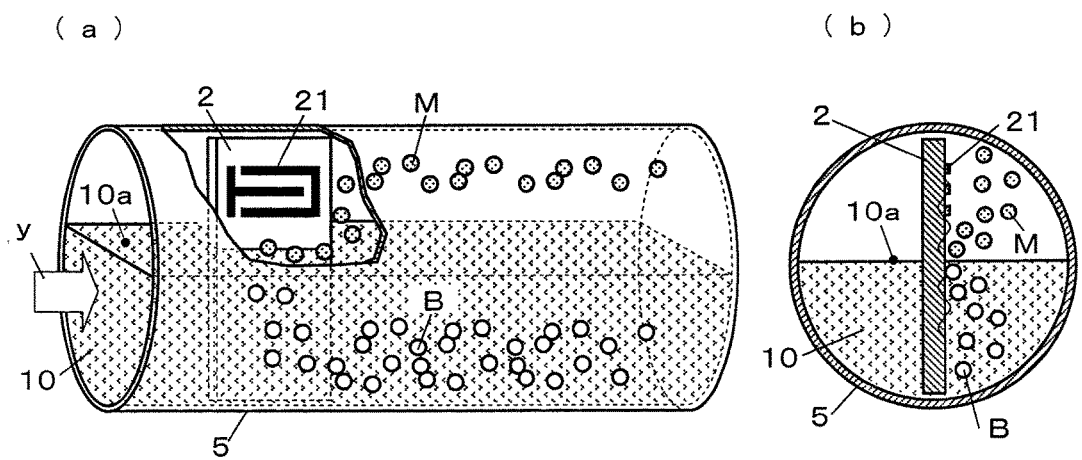
FIG. 22 is a cross-sectional view of a generator showing a generating method for the mist and the fine-bubbles according to further another modification of the first embodiment.
Figure 23:
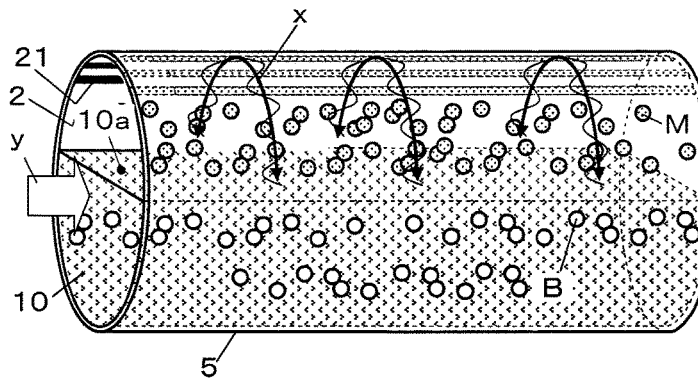
FIG. 23 is a cross-sectional view of a generator showing a modification of the method.
Figure 23:
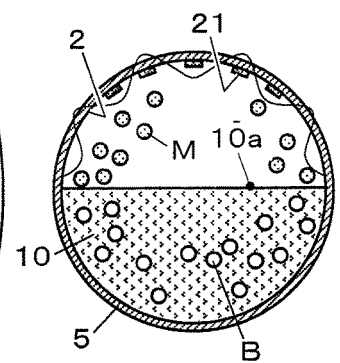

FIG. 22 and FIG. 23 show further another modification of the first embodiment. This modification generates the fine-bubbles B in the liquid 10 which flows through an inside of a tubular structure 5 into an arrow-head direction-y along the direction of a pipe. A space where gas exists is located inside of the tubular structure 5, and the gas is flowing into the arrow-head direction-y with the liquid 10. Inside such tubular structure 5, a piezoelectric substrate 2 like the piezoelectric substrate 2 in the first embodiment is arranged. The mist M and the fine-bubbles B generated at the piezoelectric substrate 2 go off from the piezoelectric substrate 2 one by one, respectively, and flow along the flow of the gas and the liquid 10. A liquid current of the direction-y can be made by potential energy, or by a pump additionally provided. Moreover, the gas flow can be a flow made by a drag caused by the liquid current, or a generated flow by a pressure difference made compulsorily. For the tubular structure 5, a pipe with a circular cross section or a square cross section, and also an arbitrary cross section, etc. can be used, and moreover, a guttering structure or a slit structure in an axial direction, etc. can be used.

According to this modification, since the fine-bubbles B can be made to go off from vicinity of the piezoelectric substrate 2 promptly and each of the fine-bubbles B can be made to separate by the flow of the liquid 10, combination between each of the fine-bubbles B can be prevented, and annihilation of the fine-bubbles B caused by combination grow can be suppressed, and the fine-bubbles B can be generated efficiently. Moreover, it is possible to generate the fine-bubbles B so that the density of the number of fine-bubbles in the liquid 10 becomes uniform. The liquid 10 containing such fine-bubbles B can be delivered to a desired place with the tubular structure 5 and can be used for processing of washing, and so on.

Moreover, as shown in FIG. 23, the piezoelectric substrate 2 and the electrodes 21 as the excitation means can be provided on a inner wall of the tubular structure 5, namely an inner wall of a liquid container in which the liquid 10 is accommodated. The piezoelectric substrate 2 can be provided by sticking what was formed separately on the inner wall of the structure 5, or by forming a piezoelectric thin film on the inner wall of the structure 5 and then by forming the electrodes 21 with a film formed on it. In the example shown in this figure, the electrodes 21 is arranged so that the direction of each teeth is in accordance with the axial direction of the tubular structure 5, and thus the surface acoustic wave propagates along the circumferencial direction of the structure 5. The arrangement configuration of the electrodes 21 is not only this constitution but can be made into an arbitrary direction and structures on the inner wall of the structure 5. For example, if the direction of each teeth of the electrodes 21 is made into the circumferencial direction of the structure 5, the surface acoustic wave propagates in accordance with the axial direction of the structure 5. According to this modification, with a small generator configuration, uniform and large volume fine-bubbles can be stably generated while the gas and liquid are flowing.

Second Embodiment

Figure 24:
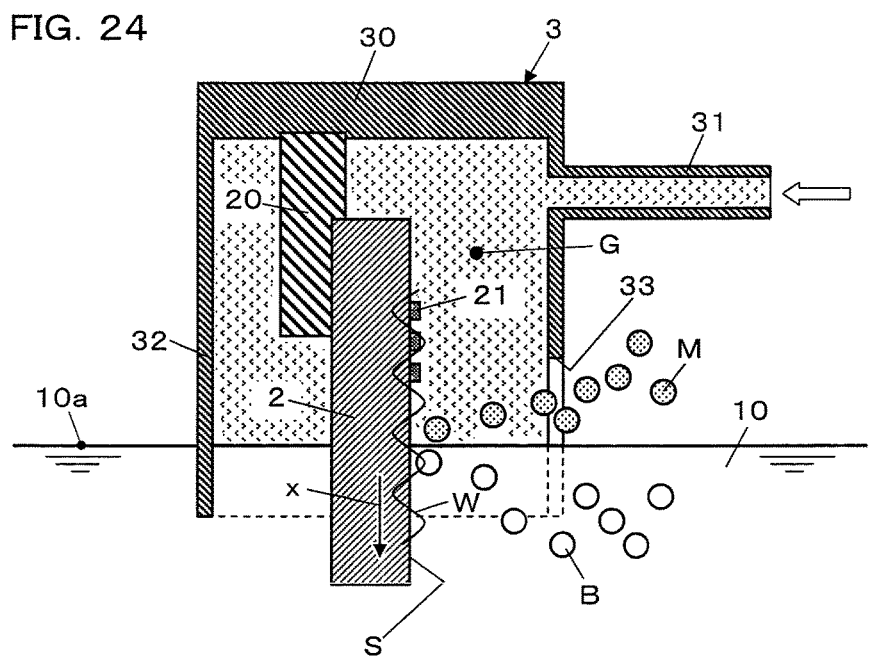
FIG. 24 is a cross-sectional view of a generator for the mist or the fine-bubbles showing a generating method for the mist or the fine-bubbles according to a second embodiment.

FIG. 24 shows the second embodiment. This embodiment is what provided a container 3 which wraps the gas side portion of the piezoelectric substrate 2 in the first embodiment, and in a space formed by the container 3 and the liquid 10 is filled with an arbitrary gas G. The container 3 forms a nearly sealed space with a ceiling 30 and a side wall 32 extended from the ceiling 30 to at least near the interface 10a. A introductory pipe 31 for introducing the gas G and an opening 33 for deriving the mist M to the exterior of the container 3 are provided in the side wall 32. The piezoelectric substrate 2 is held by the substrate-holder 20 at the ceiling 30. It is possible to dissolve desired gas G effectively in a domain of the liquid 10 where the fine-bubbles B is generated by enclosing the gas G in the nearly sealed space formed with the container 3, and then it is possible to avoid dissipating and consuming the gas G in vain. Moreover, the gas G can be made to dissolve effectively, since the gas G in the container 3 is involved into the liquid 10 according to the surface acoustic wave W propagation towards the liquid 10 side from the gas side.

According to this embodiment, the fine-bubble of desired gas can be generated easily and efficiently. This is based on the fact that the fine-bubbles B is generated from the gas which is dissolving in the liquid 10. In addition, if the side wall 32 is extended from the interface 10a into the inside of liquid 10 without forming the opening 33, it is possible to use only the liquid 10 which contains the fine-bubbles B of the gas G without taking out the mist M and to prevent the consumption of the gas G made by dissipation. Moreover, it is possible to make a space-saving generator by using the container 3 which can localize the gas G, and possible to make a further space-saving generator by making the container 3 is of the minimum volume which can contain the piezoelectric substrate 2 and its circumference in airtight. The gas G can be pressurized within the container 3 in order to promote its dissolution. The gas G can be generated within the container 3, without introducing from outside. For example, oxygen as the gas G can be generated by the oxygen permeable membrane which can make oxygen concentration high only by making air pass it.

Figure 25:
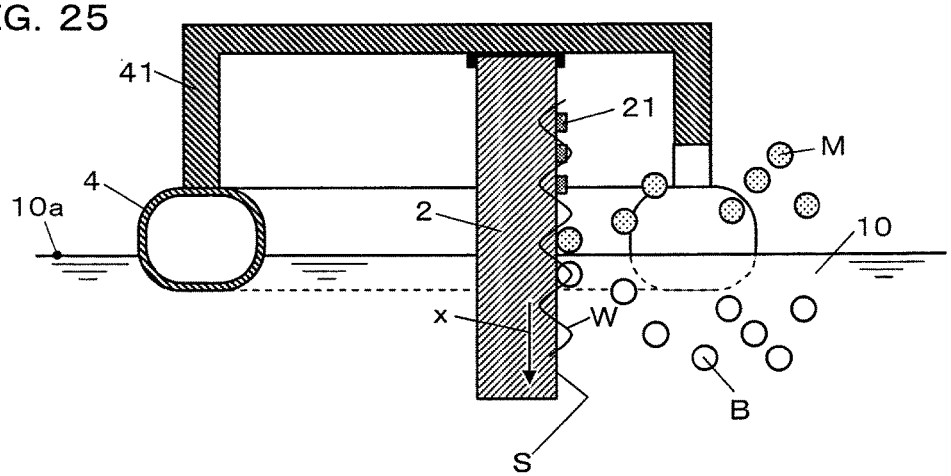
FIG. 25 is a cross-sectional view of a generator showing a generating method for the mist and the fine-bubbles according to a modification of the second embodiment.

FIG. 25, FIG. 26, FIG. 27, and FIG. 28 show modifications of the second embodiment. As shown in FIG. 25, this modification is what the piezoelectric substrate 2 in the first embodiment is supported at a fixed height position from the liquid level 10a by a floating body 4. The floating body 4 has a shape of C-type which surrounds the piezoelectric substrate 2 in plan view, and the open part of the shape of C-type is prepared in order to pass the mist M through. The piezoelectric substrate 2 is fixed to the floating body 4 by a support 41. By the way, in the first embodiment (refer to FIG. 1) above-mentioned, there is a problem that a generating position of the mist M and the fine-bubbles B is changed up and down, when the height of the liquid level 10a of the liquid 10 in the liquid container 11 is changed up and down, since the piezoelectric substrate 2 is fixed to the liquid container 11 by the holder 20.

According to this modification, a generating condition can be fixed and the mist M and the fine-bubbles B can be generated stably, since the position of the up and down direction of the piezoelectric substrate 2 can be maintained stably and automatically in a fixed height to the liquid 10 in which the height of the liquid level 10a changes. Moreover, since the piezoelectric substrate 2 is in the floating state, horizontal position changes and position keeping in the liquid level 10a are easy. In addition, the floating body 4 is not limited to the shape of C-type, but two or more floats of arbitrary shape can be combined and used for it. Moreover, an arbitrary shape component can be used for the support 41 which fixes the floating body 4 and the piezoelectric substrate 2, for example, a bar, a plate, and a lid-like component, etc., any of sealing and not sealing may be sufficient, and the floating body 4 and the support 41 can be combined to make an integral construction. Moreover, a moving guide, a latch, etc. can be provided to the liquid container in order to move the floating body 4 smoothly and the piezoelectric substrate 2 supported with it, vertically or horizontally relative to the liquid container.

Figure 26:
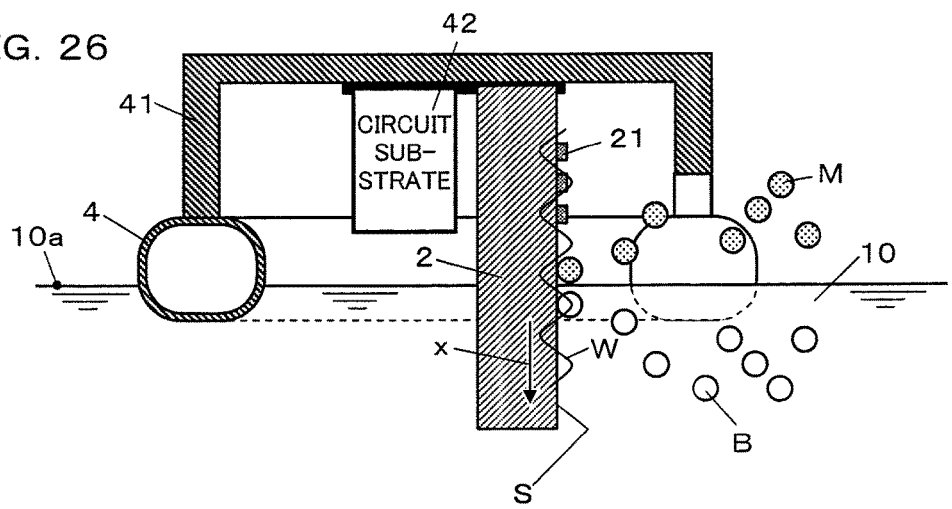
FIG. 26 is a cross-sectional view of a generator showing a modification of the method.
Figure 27:
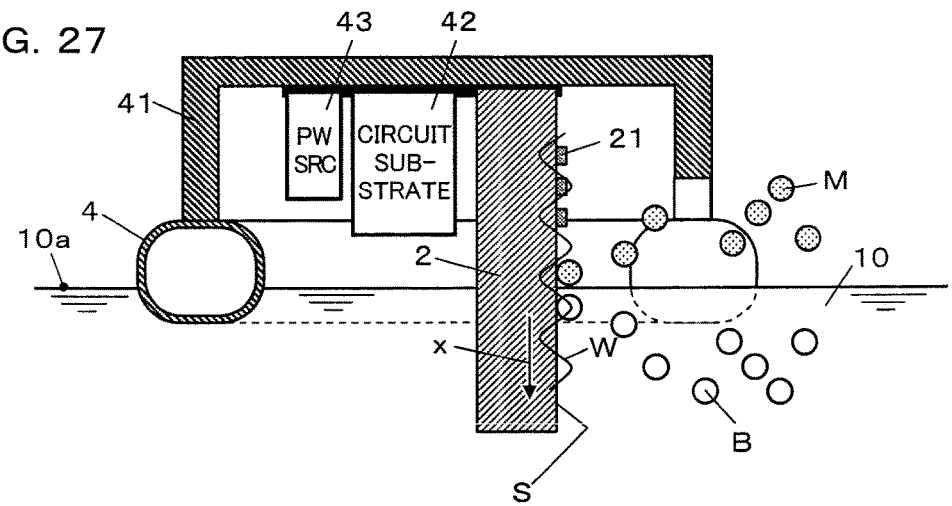
FIG. 27 is a cross-sectional view of a generator showing another modification of the method.

Moreover, as shown in FIG. 26 and FIG. 27, with the support component 41, in addition to the piezoelectric substrate 2, a circuit substrate 42 can be supported by the floating body 4, or a power source 43 can also be further supported by the floating body 4. Here, the circuit substrate 42 is a circuit substrate including a circuit for controlling excitation of the surface acoustic wave W by controlling the high-frequency voltage impressed on the electrodes 21 for example, and the power source 43 includes a power source for controlling the circuit substrate 42 and a power source for impressing and driving the electrodes 21. A battery may be sufficient as the power source 43, and a generator or a circuit for generating electricity by energies, such as vibration, light, or a water stream, can be sufficient as it. Moreover, it is preferable to constitute the support component 41 and the floating body 4 from a conductive material, and to use them as an electromagnetic wave shield for external noise suppression.

According to such a modification, the influence of power loss or a noise can be minimized, since the close arrangement of the circuit substrate 42 and the piezoelectric substrate 2 can be carried out. Moreover, external wiring etc. become unnecessary by holding the power source 43 by the floating body 4, and the generator 1 can be constituted as an independent unit by including an apparatus required for generating the mist M or the fine-bubbles B in addition to the piezoelectric substrate 2, and an installation of the unit or the increase and decrease of the number of the unit are easy, and the mist M and the fine-bubbles B can be generated easily.

Figure 28:
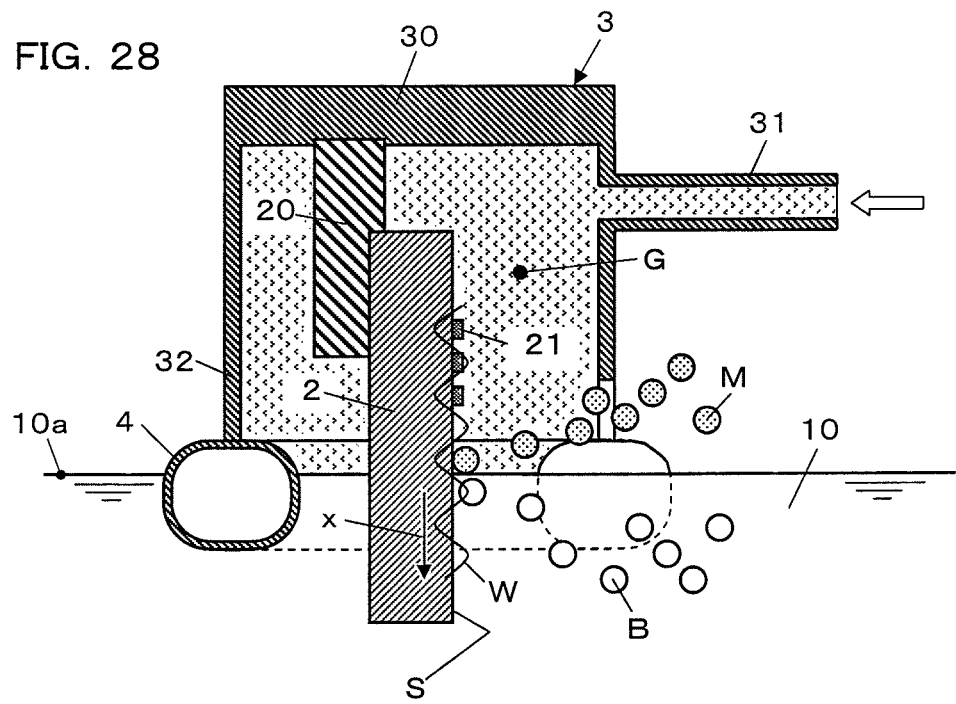
FIG. 28 is a cross-sectional view of a generator showing further another modification of the method.

Moreover, as shown in FIG. 28, the constitution of the floating body 4 in this modification is also combinable with the 13th embodiment (mistake, correctly shown in FIG. 24) above-mentioned. Such a combination can be applied also to each modification of above-mentioned FIG. 26 and FIG. 27, and the introductory effect of the gas G and the effect of the height maintenance by the floating body 4 can be brought out by each combination.

Third Embodiment

Figure 29:
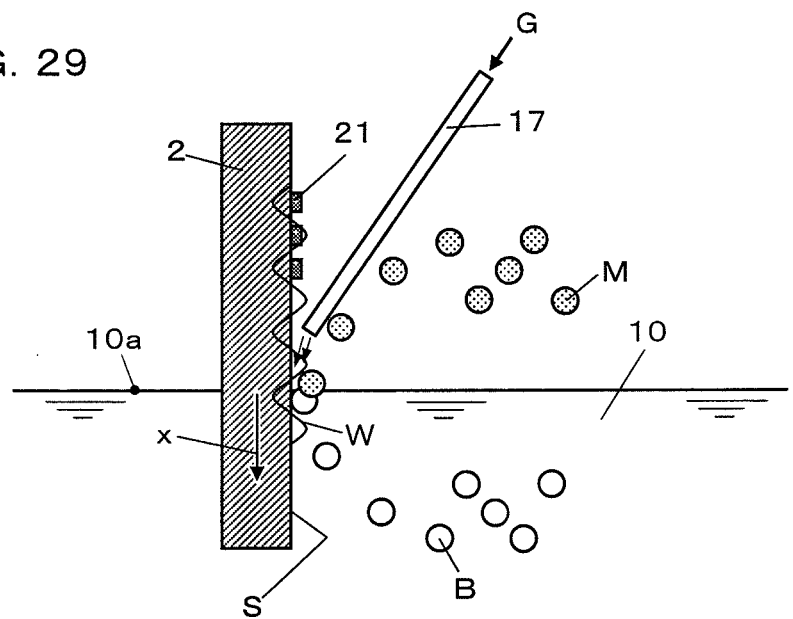
FIG. 29 is a cross-sectional view of a generator for the mist or the fine-bubbles showing a generating method for the mist or the fine-bubbles according to a third embodiment.

FIG. 29 shows the third embodiment. This embodiment is what provided with a gas supplying pipe 17 in the first embodiment, and an arbitrary gas G is supplied to the liquid 10 with the gas supplying pipe 17 from the gas side along the surface S. It is possible to efficiently generate the fine-bubbles B which consists of the desired gas G by supplying the gas G to the liquid 10 along the surface S, since it is possible to directly and effectively supply the desired gas G to the domain where the fine-bubbles B are generated and to dissolve the desired gas G in the liquid.

Figure 30:
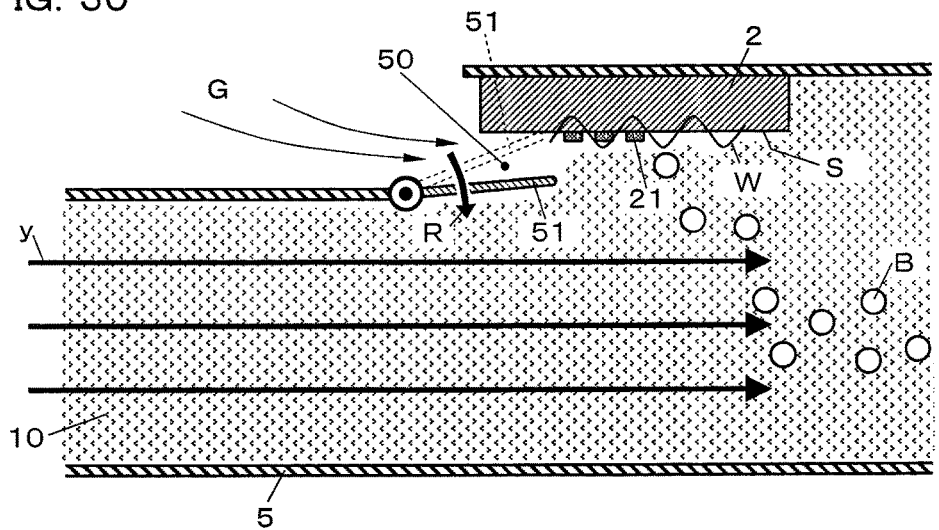
FIG. 30 is a cross-sectional view of a generator showing a generating method for the mist and the fine-bubbles according to a modification of the third embodiment.
Figure 31:
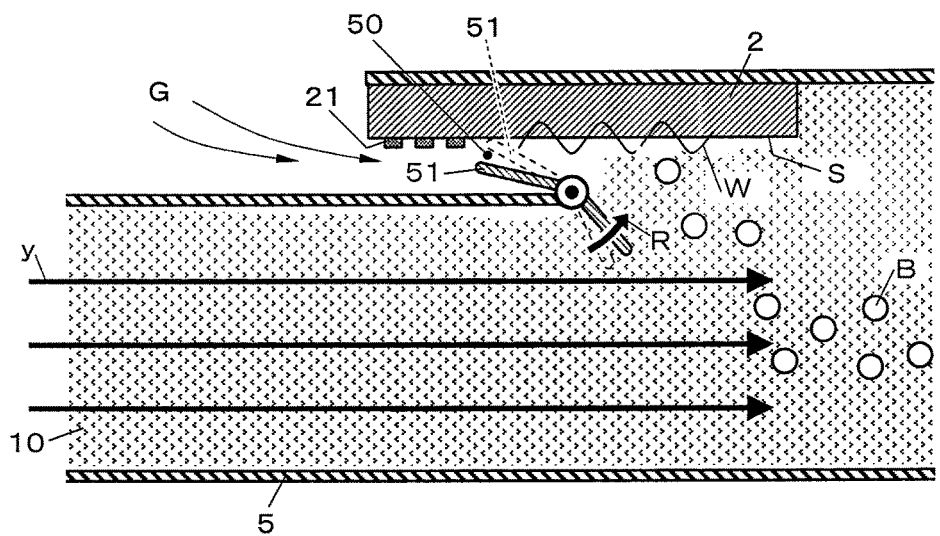
FIG. 31 is a cross-sectional view of a generator showing a modification of the method.

FIG. 30 and FIG. 31 show the modification of the third embodiment. This modification is, as shown in FIG. 30, made to adaptively supply the gas G in the third embodiment shown in above-mentioned FIG. 29. The liquid 10 is flowing into one way (direction-y) in a tubular liquid container 5 which has an aperture 50 in part, and the piezoelectric substrate 2 is provided at the position which is on an upper wall surface of the liquid container 5 in the downstream of the aperture 50 near the aperture 50 with the surface S facing the liquid 10. The electrodes 21 on the surface S is in the aperture 50 side (upstream), and excites the surface acoustic wave W propagating from the aperture 50 side to a downstream direction. The aperture 50 is provided with a gas supply valve 51 which operates so that the aperture 50 is blockaded when a flow velocity of the liquid 10 is low and an opening of the aperture 50 is increased with the flow velocity rise. The gas supply valve 51 carries out an open operation R by a suction force based on the pressure drop according to the increase in the flow velocity, that is, adaptively to the flow velocity. The desired gas G is in contact with the outer side (it is the opposite side of the liquid 10) of this gas supply valve 51, and the gas G is supplied to the liquid 10 according to the degree of the opening of the aperture 50 depending on the operation of the gas supply valve 51. Moreover, as shown in FIG. 31, the gas supply valve 51 can carry out the open operation R by a kinetic energy of the liquid 10 which increases with the flow velocity rise of the liquid 10.

According to these modifications, the arbitrary gas G which is dissolved into the liquid 10 and made to be contained in the fine-bubbles B can be supplied adaptively to the liquid 10 according to the flow rate or the flow velocity of the liquid 10. Therefore, the gas G is not consumed in vain, and when it is expensive gas, the generator can be operated at low cost. A spring or a weight can be used so that the gas supply valve 51 can be closed when the liquid 10 is not flowing. Moreover, an area of the part which receives the suction force or the kinetic energy can be made wide so that open operation can be carried out and the gas G can be supplied even if the flow velocity is low or there are few flow rates. The gas supply valve 51 shown in FIG. 30 or FIG. 31 has a simple structure directly opened and closed by the flow of the liquid 10. As an alternative of like this constitution, a distant control constitution can be used, which is constituted by dividing, without linking directly the roles of the portion which receives a suction force or kinetic energy and of the portion which carries out supply control of the gas G and by providing between a linkage mechanism, a signaling system, and an actuator.

In addition, various modification is possible for the present invention, without being restricted to each above-mentioned embodiment and the constitution of each modification. For example, each embodiment mentioned above and constitution of each modification can be mutually combined to yield other constitutions. The method and generator of the present invention using a surface acoustic wave can generate, especially, mist or fine-bubble of submicron or nanometer order in diameter, and the gas or the liquid containing such a mist or fine-bubble can be conveniently used as various kinds of cleaning fluid, chemical reaction liquid for processing or reaction promotion, physiological function liquid, and so on. For example, it can be used for in-a-mist-washing of a machine part after processing, an electronic circuit substrate, various semiconductor substrates such as a silicon substrate, tableware, and so on. A plurality of piezoelectric substrates 2 can be combined and used. Moreover, it is effective to prevent combination growth between mist droplets or between fine-bubbles for the generation of the mist or the fine-bubbles of much smaller size more stably and effectively, and therefore, as mentioned above, means for generating a relative flow velocity between the piezoelectric substrate 2 and the liquid 10, and also means for charging the mist or the fine-bubbles are preferably used as the particle combination prevention means.

This application is based on the Japan patent application 2009-148112, and the contents should be united to the present application invention as a result by referring to the specification and figures of the above-mentioned patent application.

What is claimed is:

1. A generating method for generating one of mist and fine-bubbles or fine-bubbles, comprising the steps of:

arranging in a liquid a part of a piezoelectric substrate having a surface, said surface intersecting a mutual interface of gas and the liquid and equipped thereon with an excitation source including a plurality of electrodes to excite a surface acoustic wave;

generating a flow of the liquid using a liquid flow generator that generates the flow of the liquid relative to the piezoelectric substrate;

exciting a surface acoustic wave on the surface with the excitation source;

propagating the excited surface acoustic wave along the surface so that the surface acoustic wave exists on upper and lower sides of the interface to generate mist on a gas side above the lower side of the interface and to generate fine-bubbles on a liquid side below the upper side of the interface;

carrying the generated fine-bubbles away from the piezoelectric substrate with the generated flow of the liquid; and drawing the liquid containing the fine-bubbles from a liquid container which contains the liquid.

2. A generator for generating one of mist and fine-bubbles or fine-bubbles at an interface of a gas and a liquid, comprising:

a piezoelectric substrate equipped with an excitation source on a surface thereof, the excitation source including a plurality of electrodes to excite a surface acoustic wave;

a substrate-holder holding the substrate, a part of the substrate being disposed in the liquid so that the surface intersects the mutual interface of the gas and the liquid;

a liquid flow generator that generates a flow of the liquid relative to the piezoelectric substrate; and a pipe through which the liquid is drawn from a container containing the liquid, wherein when a surface acoustic wave is excited and exists on upper and lower sides of the interface on the surface of the piezoelectric substrate, the surface acoustic wave propagates along the surface from a gas side for generating mist above the lower side of the interface to a liquid side for generating fine bubbles below the upper side of the interface, the flow of the liquid carries the generated fine-bubbles away from the piezoelectric substrate, and the liquid containing the fine bubbles is drawn through the pipe.

* * * * *